US012368849B2

(12) United States Patent
Zhao et al.

(10) Patent No.: US 12,368,849 B2
(45) Date of Patent: Jul. 22, 2025

(54) FLEXIBLE PICTURE PARTITIONING

(71) Applicant: TENCENT AMERICA LLC, Palo Alto, CA (US)

(72) Inventors: Liang Zhao, Palo Alto, CA (US); Xin Zhao, Palo Alto, CA (US); Yixin Du, Palo Alto, CA (US); Shan Liu, Palo Alto, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 0 days.

(21) Appl. No.: 18/367,695

(22) Filed: Sep. 13, 2023

(65) Prior Publication Data
US 2023/0421761 A1    Dec. 28, 2023

Related U.S. Application Data

(63) Continuation of application No. 17/741,072, filed on May 10, 2022, now Pat. No. 11,800,106, which is a
(Continued)

(51) Int. Cl.
*H04N 19/119* (2014.01)
*H04N 19/169* (2014.01)
(Continued)

(52) U.S. Cl.
CPC ......... *H04N 19/119* (2014.11); *H04N 19/172* (2014.11); *H04N 19/1883* (2014.11); *H04N 19/46* (2014.11); *H04N 19/70* (2014.11)

(58) Field of Classification Search
CPC .................................................... H04N 19/51
See application file for complete search history.

(56) References Cited

U.S. PATENT DOCUMENTS

| | | | |
|---|---|---|---|
| 2012/0082238 A1 | 4/2012 | Panusopone et al. | |
| 2021/0266540 A1 | 8/2021 | Yasugi et al. | |
| 2022/0337818 A1* | 10/2022 | Paluri | H04N 19/132 |

FOREIGN PATENT DOCUMENTS

| | | | | |
|---|---|---|---|---|
| GB | 2557430 A | 6/2018 | | |
| JP | WO 2019/131651 | * | 7/2019 | H04N 19/51 |

(Continued)

OTHER PUBLICATIONS

Benjamin Bross, "Versatile Video Coding (Draft 7)", Joint Video Experts Team (JVET) of ITU-T SG 16 WP 3 and ISO/IEC JTC 1/SC 29/WG 11, JVET-P2001-vE, Oct. 1-11, 2019, pp. 1-453, 16th Meeting, Geneva, CH.
(Continued)

*Primary Examiner* — Jerry T Jean Baptiste
(74) *Attorney, Agent, or Firm* — Sughrue Mion, PLLC

(57) ABSTRACT

Systems and methods may provide flexible picture partitioning, a method includes receiving a bitstream, that includes a picture, the picture partitioned into a plurality of coding tree units (CTUs), wherein at least one row or column of CTUs, among the plurality of CTUs of the picture, that is adjacent to a boundary of the picture has a size dimension that is smaller than a corresponding size dimension of each CTU among the plurality of CTUs that is not adjacent to any boundary of the picture; and encoding the bitstream based on the plurality of CTUs, wherein the at least one row or column of CTUs includes a first CTU row or a first CTU column of the picture that is adjacent to a top boundary or left boundary of the picture, respectively.

20 Claims, 18 Drawing Sheets

Related U.S. Application Data continuation of application No. 17/098,918, filed on Nov. 16, 2020, now Pat. No. 11,412,222.

(60) Provisional application No. 62/975,505, filed on Feb. 12, 2020.

(51) Int. Cl.
  *H04N 19/172* (2014.01)
  *H04N 19/46* (2014.01)
  *H04N 19/70* (2014.01)

(56) References Cited

FOREIGN PATENT DOCUMENTS

| WO | 2012/044707 A1 | 4/2012 |
|---|---|---|
| WO | 2019/047763 A1 | 3/2019 |
| WO | 2019/072367 A1 | 4/2019 |
| WO | 2019/131651 A1 | 7/2019 |

OTHER PUBLICATIONS

Extended European Search Report dated Mar. 9, 2022 in European Application No. 21754661.3.

International Search Report issued Apr. 23, 2021 in International Application No. PCT/US2021/016344.

Krit Panusopone et al., "Flexible Picture Partitioning", Joint Collaborative Team on Video Coding (JCT-VC) of ITU-T SG16 WP3 and ISO/IEC JTC1/SC29/WG11, Document: JCTVC-C260, 2010, pp. 1-12 (12 pages total).

Notification of reasons for refusal dated Oct. 18, 2022 from the Japanese Patent Office in Japanese Application No. 2021-559114.

Peter de Rivaz et al., "AV1 Bitstream & Decoding Process Specification", Version 1.0.0 with Errata 1, pp. 1-681.

Written Opinion of the International Searching Authority issued Apr. 23, 2021 in International Application No. PCT/US2021/016344.

Yue Chen et al., "An Overview of Core Coding Tools in the AV1 Video Codec", PCS 2018, pp. 41-45.

\* cited by examiner

680

681

682

683

684

685

686

687

689

688

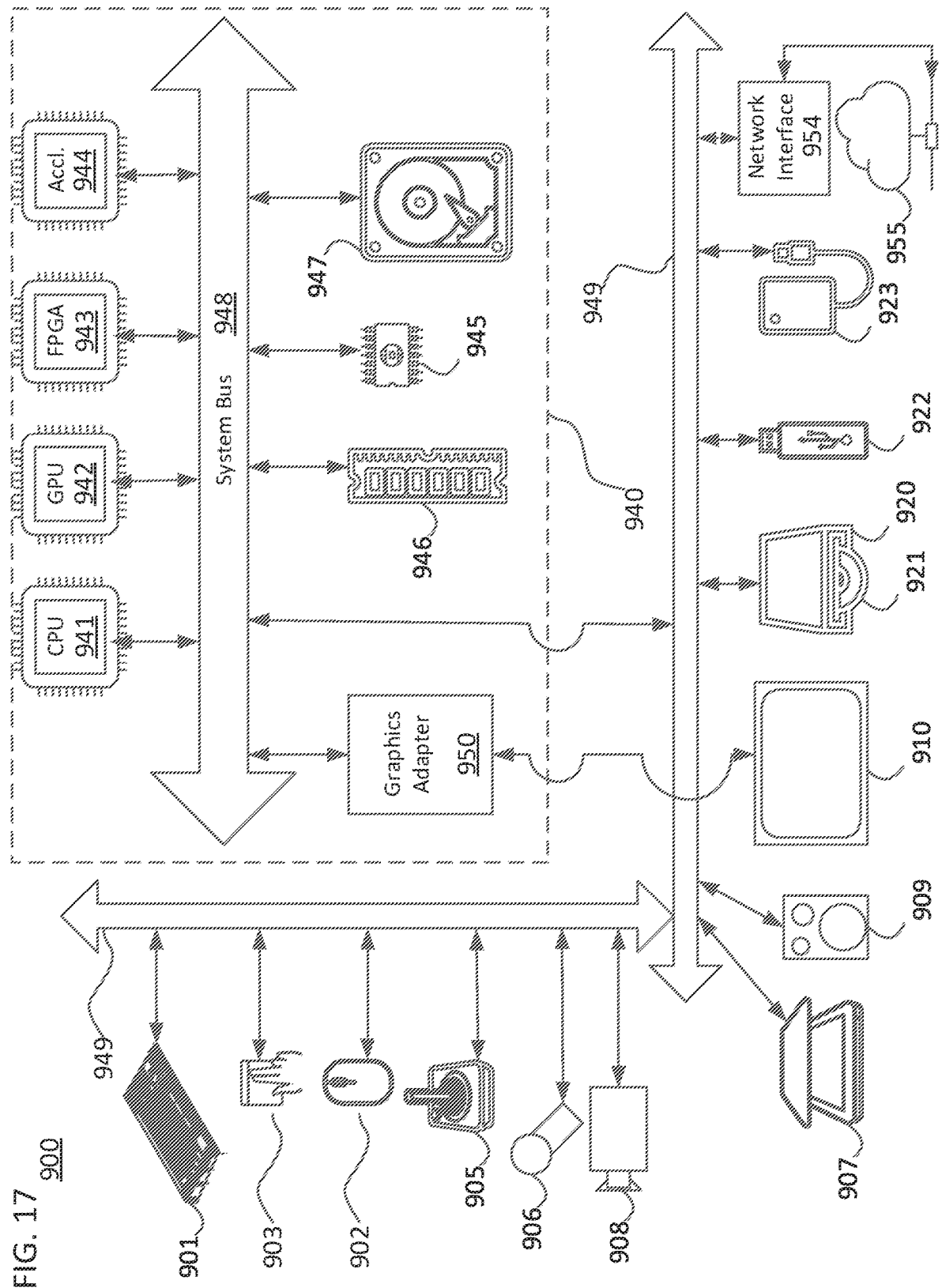

FLEXIBLE PICTURE PARTITIONING

CROSS-REFERENCE TO RELATED APPLICATIONS

This application is a Continuation of U.S. application Ser. No. 17/741,072, filed on May 10, 2022, which is a Continuation of U.S. application Ser. No. 17/098,918, filed on Nov. 16, 2020 and now U.S. Pat. No. 11,412,222 issued Aug. 9, 2022, which claims priority from U.S. Provisional Application No. 62/975,505, filed on Feb. 12, 2020, the disclosures of which are incorporated herein by reference in their entirety.

FIELD

Embodiments of the present disclosure are directed to a set of advanced video coding technologies. More specifically, embodiments of the present disclosure may provide flexible picture partitioning.

BACKGROUND

AOMedia Video 1 (AV1) is an open video coding format designed for video transmissions over the Internet. It was developed as a successor to VP9 by the Alliance for Open Media (AOMedia), a consortium founded in 2015 that includes semiconductor firms, video on demand providers, video content producers, software development companies, and web browser vendors. Many of the components of the AV1 project were sourced from previous research efforts by Alliance members. Individual contributors started experimental technology platforms years before: Xiph's/Mozilla's Daala published code in 2010, Google's experimental VP9 evolution project VP10 was announced on Sep. 12, 2014, and Cisco's Thor was published on Aug. 11, 2015. Building on the codebase of VP9, AV1 incorporates additional techniques, several of which were developed in these experimental formats. The first version, version 0.1.0, of the AV1 reference codec was published on Apr. 7, 2016. The Alliance announced the release of the AV1 bitstream specification on Mar. 28, 2018, along with a reference, software-based encoder and decoder. On Jun. 25, 2018, a validated version 1.0.0 of the specification was released. On Jan. 8, 2019, "AV1 Bitstream & Decoding Process Specification" was released, which is a validated version 1.0.0 with Errata 1 of the specification. The AV1 bitstream specification includes a reference video codec. The "AV1 Bitstream & Decoding Process Specification" (Version 1.0.0 with Errata 1), The Alliance for Open Media (Jan. 8, 2019), is incorporated herein in its entirety by reference.

ITU-T VCEG (Q6/16) and ISO/IEC MPEG (JTC 1/SC 29/WG 11) published version 1 of the H.265/HEVC (High Efficiency Video Coding) standard in 2013, version 2 in 2014, version 3 in 2015, and version 4 in 2016. In 2015, these two standard organizations jointly formed the Joint Video Exploration Team (JVET) to explore the potential of developing the next video coding standard beyond HEVC. In October 2017, JVET issued the Joint Call for Proposals on Video Compression with Capability beyond HEVC (CfP). By Feb. 15, 2018, total 22 CfP responses on standard dynamic range (SDR), 12 CfP responses on high dynamic range (HDR), and 12 CfP responses on 360 video categories were submitted, respectively. In April 2018, all received CfP responses were evaluated in the 122 MPEG/10th JVET meeting. As a result of this meeting, JVET formally launched the standardization process of next-generation video coding beyond HEVC. The new standard was named Versatile Video Coding (VVC), and JVET was renamed as Joint Video Expert Team. The specification for the VVC standard, "Versatile Video Coding (Draft 7)", JVET-P2001-vE, Joint Video Experts Team (October 2019), is incorporated herein in its entirety by reference.

SUMMARY

In modern video coding standards, such as H.264/AVC, HEVC, VVC, and AV1, a picture is divided into a sequence of CTUs with raster scan order, wherein the size of the CTUs are the same with each other except those located at the right or bottom boundary of the picture. However, if the object boundary is not aligned with this fixed picture partitioning, it will need more bits to signal the boundary and motion of the object.

Some embodiments of the present disclosure address the above problems and other problems.

According to one or more embodiments, a method performed by at least one processor is provided. The method may include: receiving a coded picture that is partitioned into a plurality of coding tree units (CTUs), wherein at least one row or column of CTUs, among the plurality of CTUs of the coded picture, that is adjacent to a boundary of the coded picture has a size dimension that is smaller than a corresponding size dimension of each CTU among the plurality of CTUs that is not adjacent to any boundary of the coded picture; and decoding the coded picture based on the plurality of CTUs, wherein the at least one row or column of CTUs includes a first CTU row or a first CTU column of the coded picture that is adjacent to a top boundary or left boundary of the coded picture, respectively.

According to an embodiment, each CTU among the plurality of CTUs that is not adjacent to any boundary of the coded picture has a same size.

According to an embodiment, the at least one row or column of CTUs includes the first CTU column that is adjacent to the left boundary of the coded picture and a last CTU column that is adjacent to a right boundary of the coded picture, and the first CTU column and the last CTU column each have a width that is smaller than a width of each CTU among the plurality of CTUs that is not adjacent to any boundary of the coded picture.

According to an embodiment, the at least one row or column of CTUs includes or further includes the first CTU row that is adjacent to the top boundary of the coded picture and a last CTU row that is adjacent to a bottom boundary of the coded picture, and the first CTU row and the last CTU row each have a height that is smaller than a height of each CTU among the plurality of CTUs that is not adjacent to any boundary of the coded picture.

According to an embodiment, the decoding the coded picture includes signaling the size dimension of the first CTU row or the first CTU column, from among the at least one row or column of CTUs, that is adjacent to the top boundary or the left boundary of the coded picture.

According to an embodiment, the size dimension of the first CTU row or the first CTU column is a positive integer that is a power of 2.

According to an embodiment, the decoding the coded picture includes: signaling a first flag that indicates whether the size dimension of the first CTU row or the first CTU column, from among the at least one row or column of CTUs, that is adjacent to the left boundary or the top boundary of the coded picture is equal to a maximum allowed CTU size; determining, based on the first flag, that the size dimension of the first CTU row or the first CTU column is not equal to the maximum allowed CTU size; and signaling, based on the determining, a second flag that indicates the size dimension of the first CTU row or the first CTU column.

According to an embodiment, the decoding the coded picture includes: disallowing horizontal or vertical splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64.

According to an embodiment, the decoding the coded picture includes: disallowing horizontal triple tree (TT) or vertical TT splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64.

According to embodiments, a height of the first or last CTU row is smaller than a maximum CTU size, and each CTU among the plurality of CTUs that is not adjacent to any boundary of the coded picture has a height that is equal to the maximum CTU size, a decision on whether the first or last CTU row is smaller than other CTUs is indicated by one syntax in a bitstream, or a width of the first or last CTU column is smaller than the maximum CTU size, and each CTU among the plurality of CTUs that is not adjacent to any boundary of the coded picture has a width that is equal to the maximum CTU size, a decision on whether the first or last CTU column is smaller than other CTUs is indicated by one syntax in the bitstream.

According to one or more embodiments, a system is provided. The system includes: at least one memory configured to store computer program code; and at least one processor configured to access the computer program code and operate as instructed by the computer program code, the computer program code including: decoding code configured to cause the at least one processor to decode a coded picture that is partitioned into a plurality of coding tree units (CTUs). At least one row or column of CTUs, among the plurality of CTUs of the coded picture, that is adjacent to a boundary of the coded picture may have a size dimension that is smaller than a corresponding size dimension of each CTU among the plurality of CTUs that is not adjacent to any boundary of the coded picture, the decoding code may be configured to cause the at least one processor to decode the coded picture based on the plurality of CTUs, and the at least one row or column of CTUs may include a first CTU row or a first CTU column of the coded picture that is adjacent to a top boundary or left boundary of the coded picture, respectively.

According to an embodiment, each CTU among the plurality of CTUs that is not adjacent to any boundary of the coded picture has a same size.

According to an embodiment, the at least one row or column of CTUs includes the first CTU column that is adjacent to the left boundary of the coded picture and a last CTU column that is adjacent to a right boundary of the coded picture, and the first CTU column and the last CTU column each have a width that is smaller than a width of each CTU among the plurality of CTUs that is not adjacent to any boundary of the coded picture.

According to an embodiment, the at least one row or column of CTUs includes or further includes the first CTU row that is adjacent to the top boundary of the coded picture and a last CTU row that is adjacent to a bottom boundary of the coded picture, and the first CTU row and the last CTU row each have a height that is smaller than a height of each CTU among the plurality of CTUs that is not adjacent to any boundary of the coded picture.

According to an embodiment, the decoding code is further configured to cause the at least one processor to signal the size dimension of the first CTU row or the first CTU column, from among the at least one row or column of CTUs, that is adjacent to the top boundary or the left boundary of the coded picture.

According to an embodiment, the decoding code is further configured to cause the at least one processor to: signal a first flag that indicates whether the size dimension of the first CTU row or the first CTU column, from among the at least one row or column of CTUs, that is adjacent to the left boundary or the top boundary of the coded picture is equal to a maximum allowed CTU size; based on the first flag, that the size dimension of the first CTU row or the first CTU column is not equal to the maximum allowed CTU size; and signal, based on the determining, a second flag that indicates the size dimension of the first CTU row or the first CTU column.

According to an embodiment, the decoding code is further configured to cause the at least one processor to: disallow horizontal or vertical splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64.

According to an embodiment, the decoding code is further configured to cause the at least one processor to: disallow horizontal triple tree (TT) or vertical TT splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64.

According to one or more embodiments, a non-transitory computer-readable medium storing computer instructions is provided. The computer instructions may be configured to, when executed by at least one processor, cause the at least one processor to: decode a coded picture that is partitioned into a plurality of coding tree units (CTUs), wherein at least one row or column of CTUs, among the plurality of CTUs of the coded picture, that is adjacent to a boundary of the coded picture has a size dimension that is smaller than a corresponding size dimension of each CTU among the plurality of CTUs that is not adjacent to any boundary of the coded picture, the computer instructions are configured to cause the at least one processor to decode the coded picture based on the plurality of CTUs, and the at least one row or column of CTUs includes a first CTU row or a first CTU column of the coded picture that is adjacent to a top boundary or left boundary of the coded picture, respectively.

BRIEF DESCRIPTION OF THE DRAWINGS

Further features, the nature, and various advantages of the disclosed subject matter will be more apparent from the following detailed description and the accompanying drawings in which:

FIG. 17 is a diagram of a computer system suitable for implementing embodiments of the present disclosure.

DETAILED DESCRIPTION

[Partitioning of the Picture into CTUs]

Figure 5:
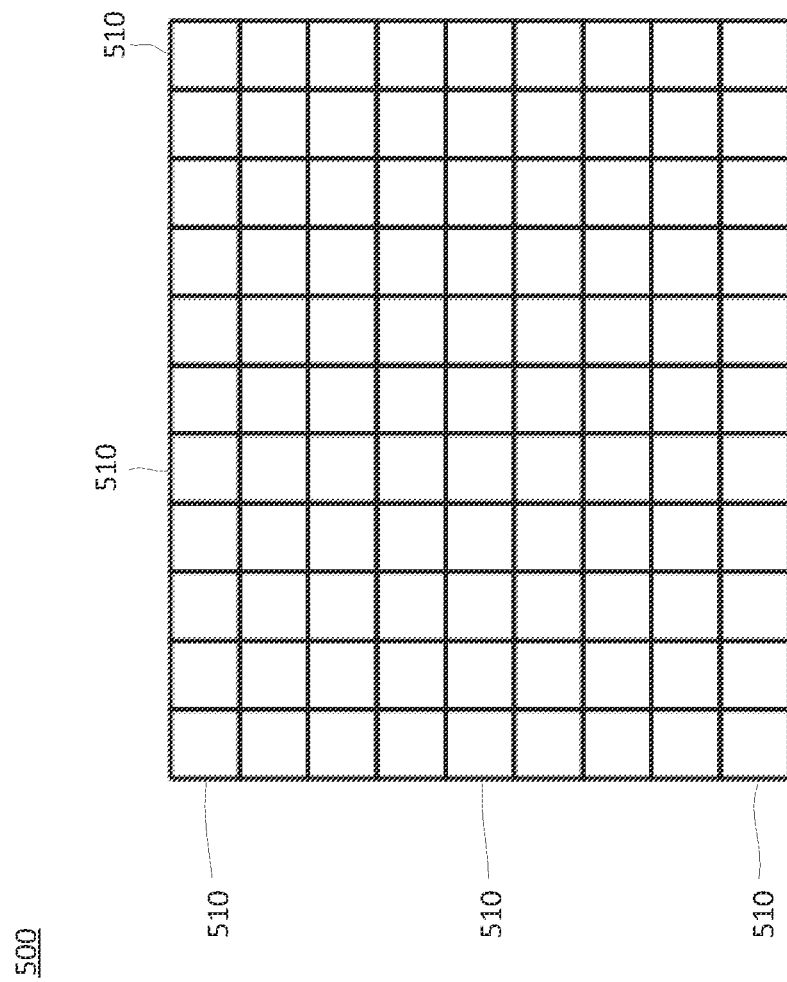
FIG. 5 is an example illustration of a picture divided into CTUs.

Pictures may be divided into a sequence of coding tree units (CTUs), which may also be called super blocks (SBs). The CTU concept in HEVC and VVC is similar to the SB concept in AV1. For a picture that has three sample arrays, a CTU may comprise or consist of an N×N block of luma samples together with two corresponding blocks of chroma samples. FIG. 5 shows an example of a picture (500) divided into CTUs (510).

The maximum allowed size of the luma block in a CTU is specified to be 128×128 (although the maximum size of luma transform blocks is 64×64).

Virtual pipeline data units (VPDUs) may be defined as non-overlapping units in a picture. In hardware decoders, successive VPDUs may be processed by multiple pipeline stages at the same time. The VPDU size is roughly proportional to the buffer size in most pipeline stages, so it may be important to keep the VPDU size small. In most hardware decoders, the VPDU size can be set to maximum transform block (TB) size.

In order to keep the VPDU size as 64×64 luma samples, the following normative partition restrictions (with syntax signaling modification) may be applied in VVC Test Model (VTM), as shown in FIGS. 6A-H, which illustrate a block (520) of a CTU having a size of 128×128, wherein the block (520) is partitioned into four VPDUs indicated with thin lines, and disallowed partitioning for CUs is indicated with partition lines (527):

Triple tree (TT) split is not allowed for a CU when one or both of the width or height of the CU is equal to 128. For example, TT split may not be allowed for the CUs as indicated in FIGS. 6A-B and 6E-H.

Figure 6A:
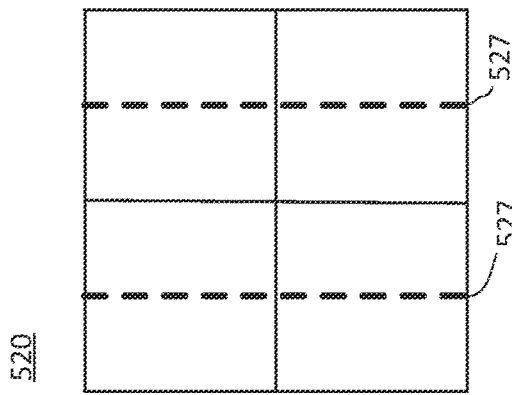
FIG. 6A is an example illustration of a block for describing a first example of partition restrictions in VTM.
Figure 6B:
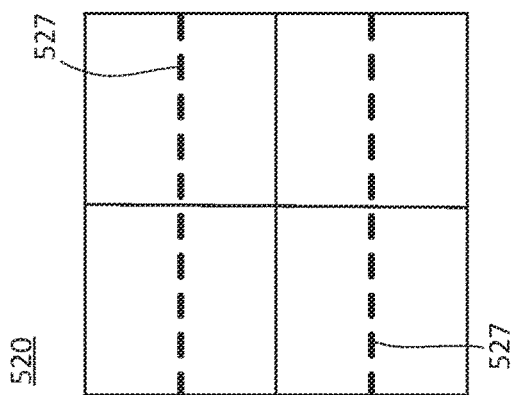
FIG. 6B is an example illustration of a block for describing a second example of partition restrictions in VTM.
Figure 6C:
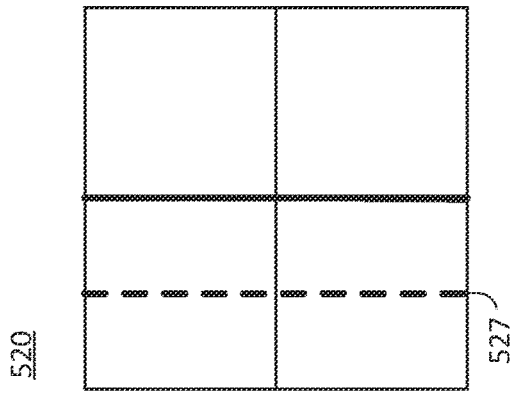
FIG. 6C is an example illustration of a block for describing a third example of partition restrictions in VTM.
Figure 6D:
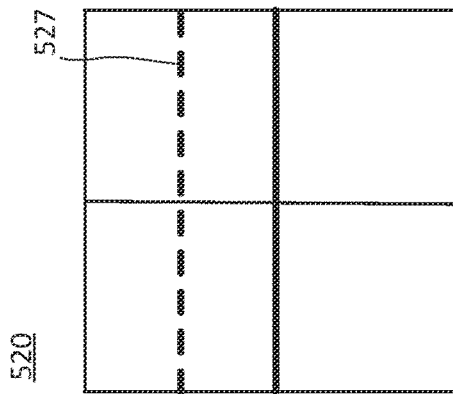
FIG. 6D is an example illustration of a block for describing a fourth example of partition restrictions in VTM.
Figure 6E:
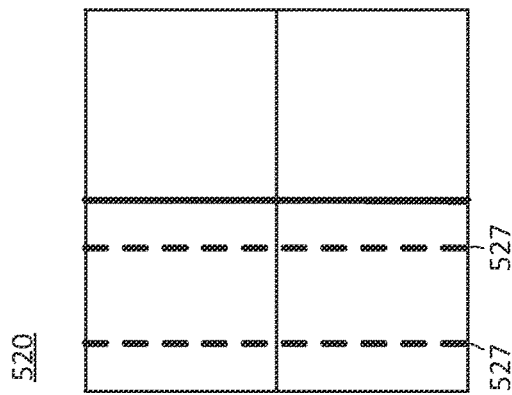
FIG. 6E is an example illustration of a block for describing a fifth example of partition restrictions in VTM.
Figure 6F:
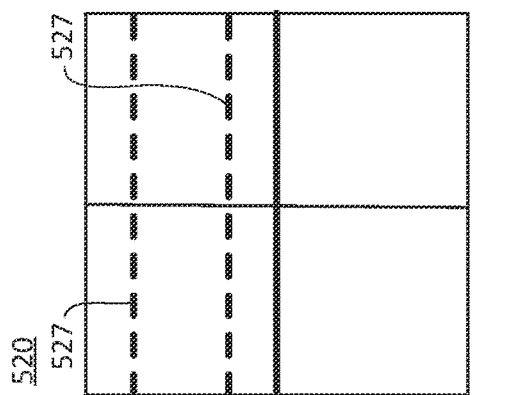
FIG. 6F is an example illustration of a block for describing a sixth example of partition restrictions in VTM.
Figure 6G:
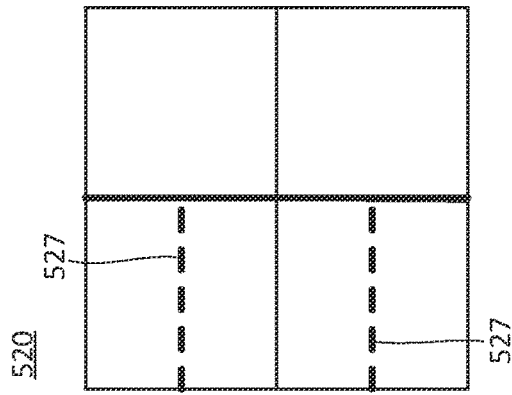
FIG. 6G is an example illustration of a block for describing a seventh example of partition restrictions in VTM.
Figure 6H:
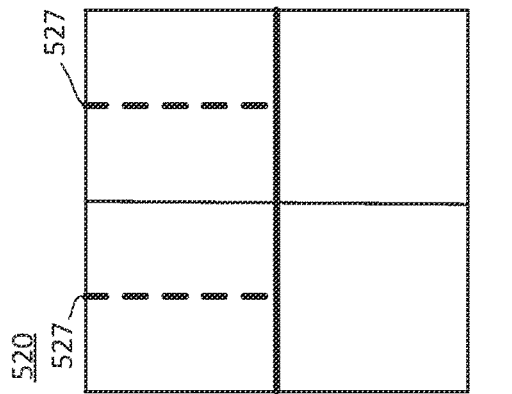
FIG. 6H is an example illustration of a block for describing an eighth example of partition restrictions in VTM.

For a 128×N CU with N≤64 (i.e. width equal to 128 and height smaller than or equal to 128), horizontal binary tree (BT) is not allowed. For example, horizontal BT split may not be allowed for the CUs as indicated in FIG. 6D.

For an N×128 CU with N≤64 (i.e. height equal to 128 and width smaller than or equal to 64), vertical BT is not allowed. For example, vertical BT split may not be allowed for the CUs as indicated in FIG. 6C.

In HEVC and VVC, when a portion of a tree node block exceeds the bottom or right picture boundary, the tree node block may be forced to be split until all samples of every coded CU are located inside the picture boundaries.

[Quadtree with Nested Multi-Type Tree Coding Block Structure in VVC]

In HEVC, a CTU may be split into CUs by using a quad tree (QT) structure denoted as coding tree to adapt to various local characteristics. The decision on whether to code a picture area using inter-picture (temporal) or intra-picture (spatial) prediction may be made at the CU level. Each CU can be further split into one, two, or four prediction units (PUs) according to the PU splitting type. Inside one PU, the same prediction process may be applied, and the relevant information is transmitted to the decoder on a PU basis. After obtaining the residual block by applying the prediction process based on the PU splitting type, a CU can be partitioned into transform units (TUs) according to another quadtree structure like the coding tree for the CU. One of key features of the HEVC structure is that it has the multiple partition concepts including CU, PU, and TU.

Figure 7A:
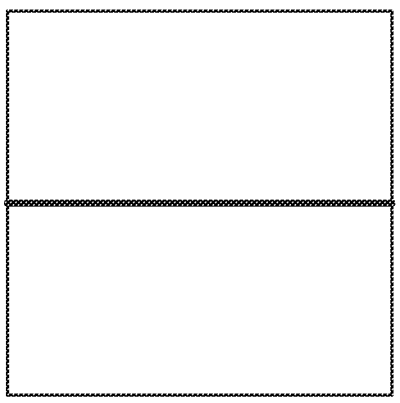
FIG. 7A is a diagram for demonstrating vertical binary splitting type in a multi-type tree structure.
Figure 7B:
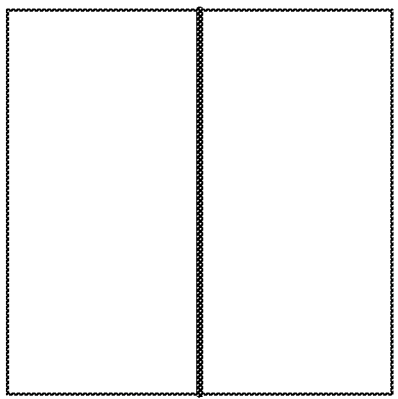
FIG. 7B is a diagram for demonstrating horizontal binary splitting type in a multi-type tree structure.
Figure 7C:
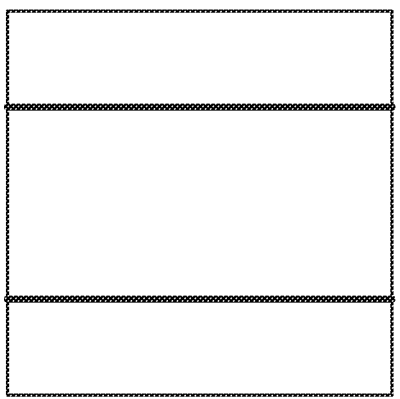
FIG. 7C is a diagram for demonstrating vertical ternary splitting type in a multi-type tree structure.
Figure 7D:
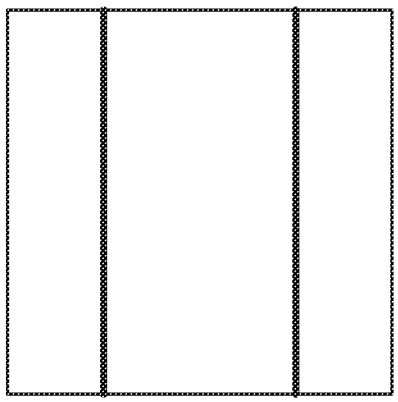
FIG. 7D is a diagram for demonstrating horizontal ternary splitting type in a multi-type tree structure.

In VVC, a quadtree with nested multi-type tree using binary and ternary splits segmentation structure replaces the concepts of multiple partition unit types. That is, VVS does not include the separation of the CU, PU, and TU concepts except as needed for CUs that have a size too large for the maximum transform length, and supports more flexibility for CU partition shapes. In the coding tree structure, a CU can have either a square or rectangular shape. A coding tree unit (CTU) is first partitioned by a quaternary tree (a.k.a. quadtree) structure. Then, the quaternary tree leaf nodes can be further partitioned by a multi-type tree structure. As shown in diagrams (550)-(580) of FIGS. 7A-D, there are four splitting types in multi-type tree structure: vertical binary splitting (SPLIT_BT_VER) as illustrated in FIG. 7A, horizontal binary splitting (SPLIT_BT_HOR) as illustrated in FIG. 7B, vertical ternary splitting (SPLIT_TT_VER) as illustrated in FIG. 7C, and horizontal ternary splitting (SPLIT_TT_HOR) as illustrated in FIG. 7D. The multi-type tree leaf nodes may be called coding units (CUs), and unless the CU is too large for the maximum transform length, this segmentation may be used for prediction and transform processing without any further partitioning. This means that, in most cases, the CU, PU, and TU have the same block size in the quadtree with nested multi-type tree coding block structure. The exception occurs when maximum supported transform length is smaller than the width or height of the color component of the CU.

Figure 8:
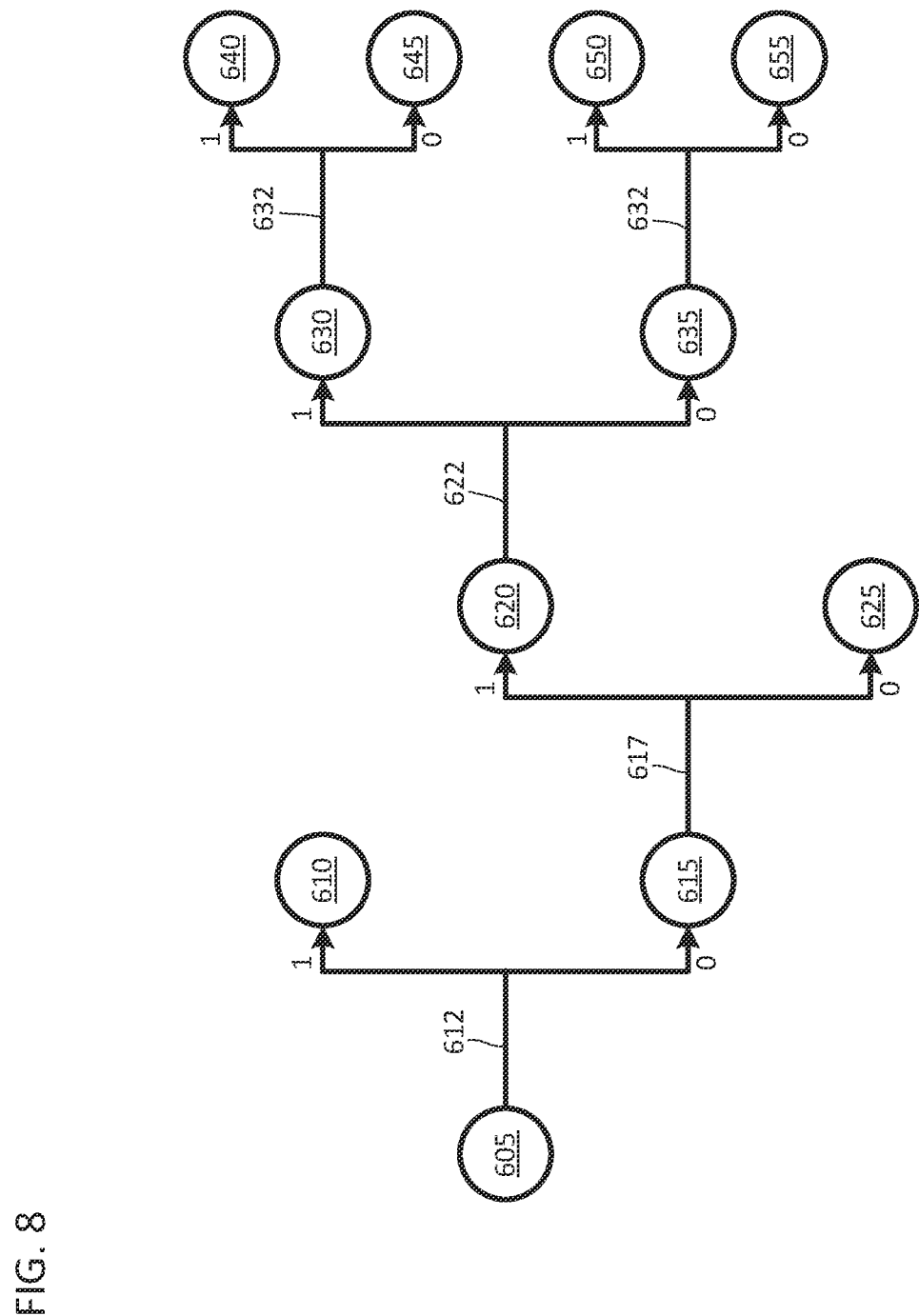
FIG. 8 is a diagram illustrating a signalling mechanism of partition splitting information in quadtree with nested multi-type tree coding tree structure.

FIG. 8 illustrates a signalling mechanism of the partition splitting information in quadtree with nested multi-type tree coding tree structure. A coding tree unit (CTU) (605) may be treated as the root of a quaternary tree and may be first partitioned by a quaternary tree structure based on a flag (612) (qt_split_flag) that is signalled. For example, when the value of the first flag (612) is "1", a quadtree partitioning may not be performed such that there are QT_nodes (610). When the value of the first flag (612) is "0", the quadtree partitioning may be performed such that there is one or more of a quaternary tree leaf node (615) (QT-leaf_node/MTT_node). Each quaternary tree leaf node (615) (when sufficiently large to allow it) is then further partitioned by a multi-type tree structure. In the multi-type tree structure, a flag (617) (mtt_split_cu_flag or mtt_split_flag) is signalled to indicate whether the quaternary tree leaf node (615) is further partitioned. For example, when a value of the flag 617 is "1", a quaternary tree leaf node (615) is further partitioned (indicated by reference character 620). And when the value of the flag (617) is "0", the quaternary tree leaf node (615) is not further partitioned (indicate by reference character 625). If the quaternary tree leaf node (615) is further partitioned, a flag (622) (mtt_split_cu_vertical_flag or mtt_split_vertical_flag) may be signalled to indicate the splitting direction. For example, if the value of the flag (622) is "1", the quaternary tree leaf node (615) may be vertically split (indicated by reference character 630), and if the value of the flag (622) is "0", the quaternary tree leaf node (615) may be horizontally split (indicated by reference character 635). A flag (632) (mtt_split_cu_binary_flag or mtt_split_binary_flag) may be signalled to indicate whether the split is a binary split or a ternary split. For example, if the value of the flag (632) is "1", the quaternary tree leaf node (615) may be binary split (indicated by reference characters 640 and 650), and if the value of the flag (632) is "0", the quaternary tree leaf node (615) may be ternary split (indicated by reference characters 645 and 655). Based on the values of the flag (622) and the flag (632), the multi-type tree splitting mode (MttSplitMode) of a CU may be derived as shown below in TABLE 1.

TABLE 1

MttSplitMode derivation based on multi-type tree syntax elements

| MttSplitMode | mtt_split_cu_vertical_flag | mtt_split_cu_binary_flag |
|---|---|---|
| SPLIT_TT_HOR | 0 | 0 |
| SPLIT_BT_HOR | 0 | 1 |
| SPLIT_TT_VER | 1 | 0 |
| SPLIT_BT_VER | 1 | 1 |

Figure 9:
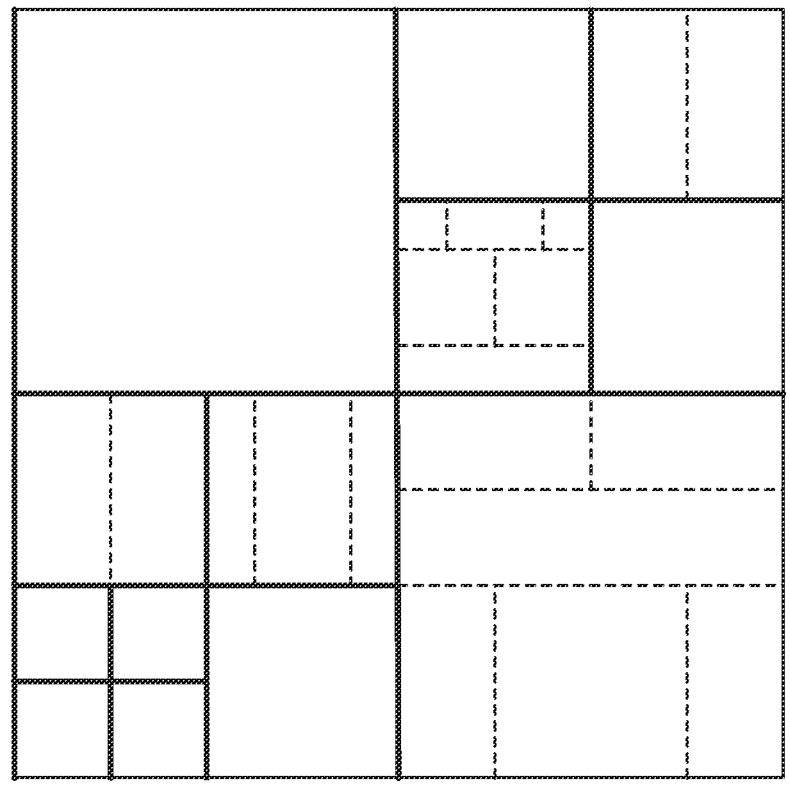
FIG. 9 is an example diagram illustrating a CTU divided into multiple CUs with a quadtree and nested multi-type tree coding block structure.
Figure 10D:
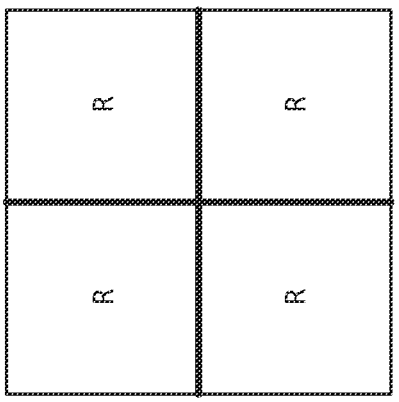
FIG. 10D a diagram illustrating a fourth example partition structure of VP9.
Figure 10C:
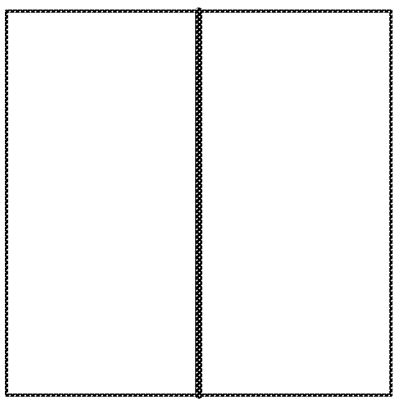
FIG. 10C a diagram illustrating a third example partition structure of VP9.
Figure 10B:
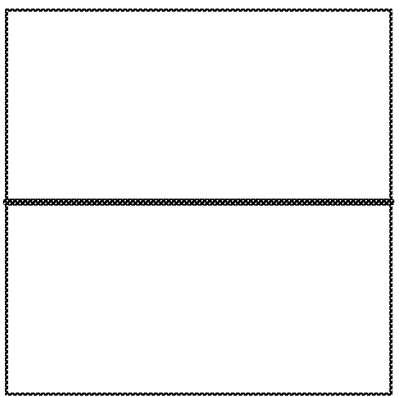
FIG. 10B a diagram illustrating a second example partition structure of VP9.
Figure 10A:
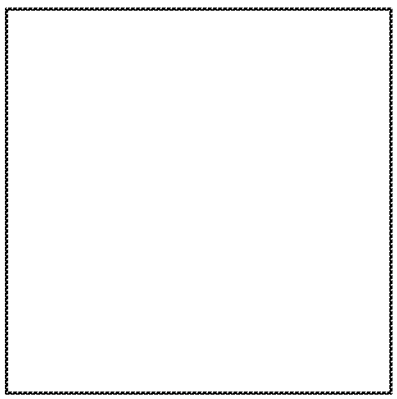
FIG. 10A a diagram illustrating a first example partition structure of VP9.
Figure 11A:
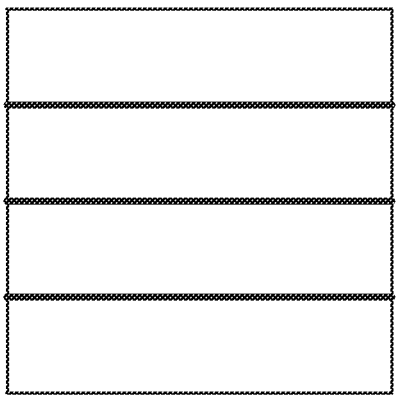
FIG. 11A a diagram illustrating a first example partition structure of AV1.
Figure 11B:
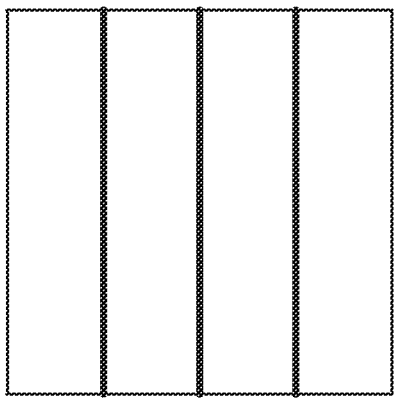
FIG. 11B a diagram illustrating a second example partition structure of AV1.
Figure 11C:
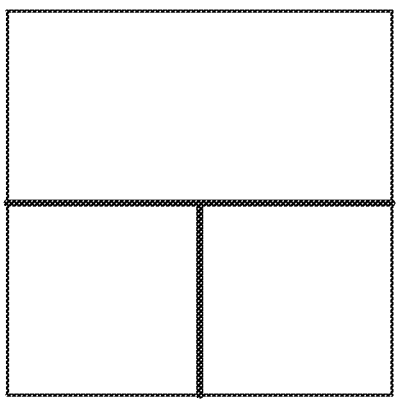
FIG. 11C a diagram illustrating a third example partition structure of AV1.
Figure 11D:
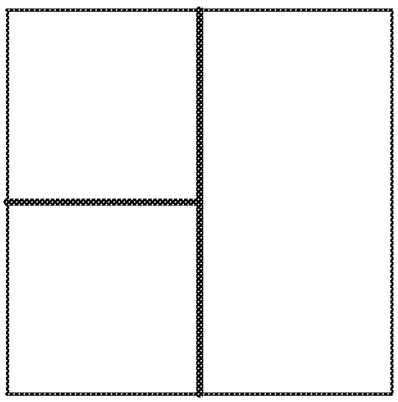
FIG. 11D a diagram illustrating a fourth example partition structure of AV1.
Figure 11E:
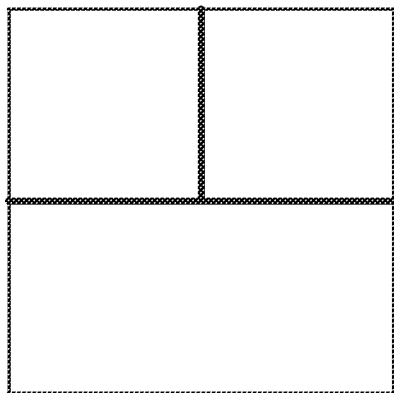
FIG. 11E a diagram illustrating a fifth example partition structure of AV1.
Figure 11F:
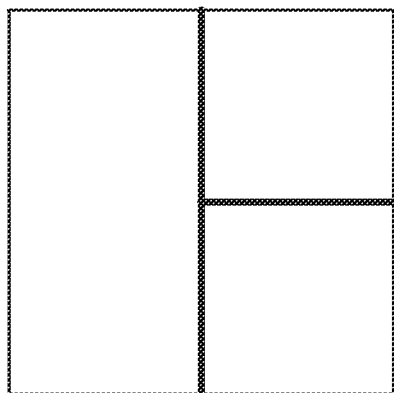
FIG. 11F a diagram illustrating a sixth example partition structure of AV1.
Figure 11G:
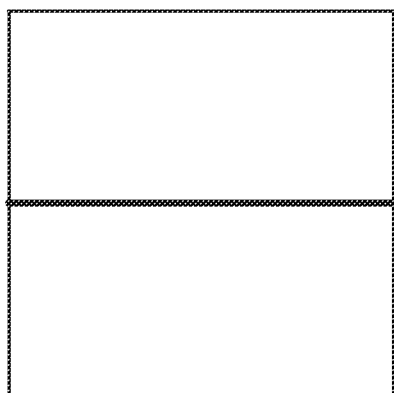
FIG. 11G a diagram illustrating a seventh example partition structure of AV1.
Figure 11H:
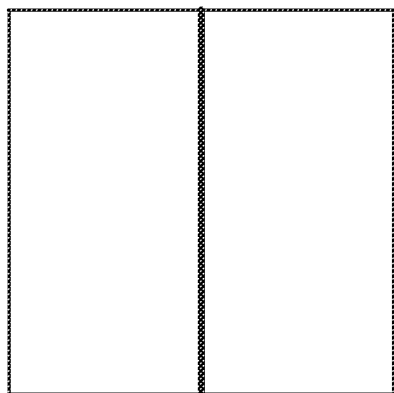
FIG. 11H a diagram illustrating an eighth example partition structure of AV1.
Figure 11J:
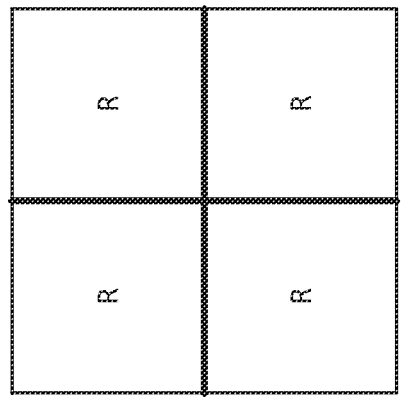
FIG. 11J a diagram illustrating a tenth example partition structure of AV1.
Figure 11I:
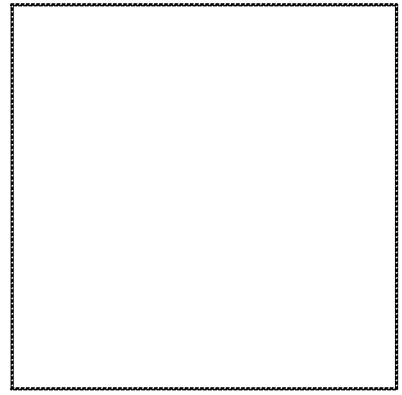
FIG. 11I a diagram illustrating a ninth example partition structure of AV1.

FIG. 9 shows a CTU (660) divided into multiple CUs with a quadtree and nested multi-type tree coding block structure, where the bold line edges represent quadtree partitioning and the broken line edges represent multi-type tree partitioning. The quadtree with nested multi-type tree partition provides a content-adaptive coding tree structure comprised of CUs. The size of the CU(s) may be as large as the CTU or as small as 4×4 in units of luma samples. For the case of the 4:2:0 chroma format, the maximum chroma CB size is 64×64 and the minimum chroma CB size is 2×2.

In VVC, the maximum supported luma transform size is 64×64 and the maximum supported chroma transform size is 32×32. When the width or height of the CB is larger than the maximum transform width or height, the CB is automatically split in the horizontal and/or vertical direction to meet the transform size restriction in that direction.

In VTM7, the coding tree scheme supports the ability for the luma and chroma to have a separate block tree structure. For P and B slices, the luma and chroma CTBs in one CTU have to share the same coding tree structure. However, for I slices, the luma and chroma can have separate block tree structures. When separate block tree mode is applied, luma CTB is partitioned into CUs by one coding tree structure, and the chroma CTBs are partitioned into chroma CUs by another coding tree structure. This means that a CU in an I slice may consist of a coding block of the luma component or coding blocks of two chroma components, and a CU in a P or B slice may consist of coding blocks of all three colour components unless the video is monochrome.

[Coding Block Partition in VP9 and AV1]

With reference to partition structures (670)-(673) of FIGS. 10A-D, VP9 uses a 4-way partition tree starting from the 64×64 level down to 4×4 level, with some additional restrictions for blocks 8×8. Note that partitions designated as R in FIG. 10D refer to recursion in that the same partition tree is repeated at a lower scale until the lowest 4×4 level is reached.

With reference to partition structures (680)-(689) of FIGS. 11A-J, AV1 not only expands the partition-tree to a 10-way structure, but also increases the largest size (referred to as superblock in VP9/AV1 parlance) to start from 128× 128. Note that this includes 4:1/1:4 rectangular partitions that did not exist in VP9. None of the rectangular partitions can be further subdivided. In addition to coding block size, coding tree depth is defined to indicate the splitting depth from the root note. To be specific, the coding tree depth for the root node, e.g. 128×128, is set to 0, and after tree block is further split once, the coding tree depth is increased by 1.

Instead of enforcing fixed transform unit sizes as in VP9, AV1 allows luma coding blocks to be partitioned into transform units of multiple sizes that can be represented by a recursive partition going down by up to 2 levels. To incorporate AV1's extended coding block partitions, square, 2:1/1:2, and 4:1/1:4 transform sizes from 4×4 to 64×64 may be supported. For chroma blocks, only the largest possible transform units may be allowed.

Embodiments of the present disclosure are discussed in detail below. The term "CTU" as used below in this disclosure may refer to a largest coding unit (LCU) of a coding standard. For example, the term "CTU" may refer to a CTU as defined in HEVC and VVC and/or an SB as defined in AV1.

Figure 1:
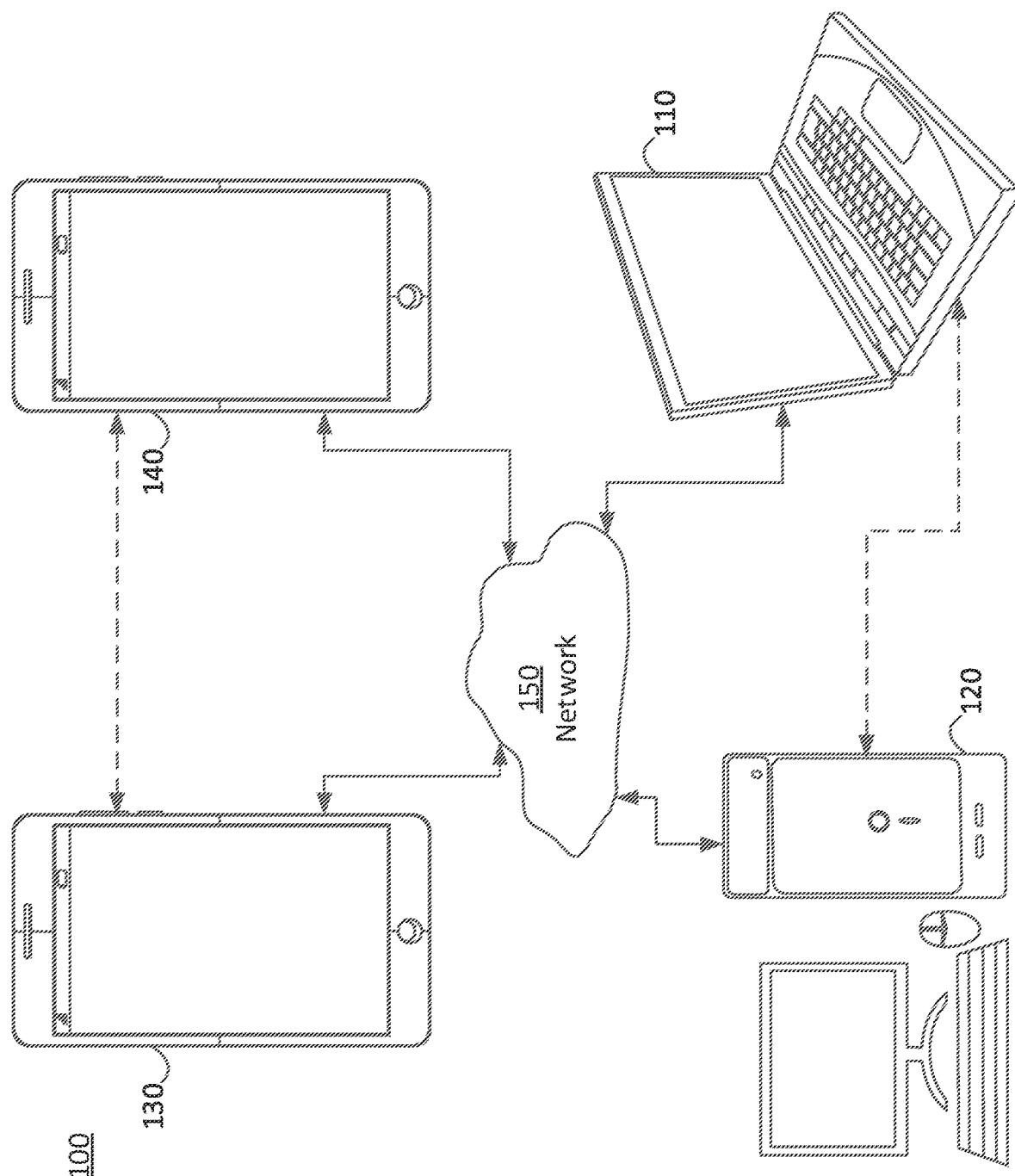
FIG. 1 is a schematic illustration of a simplified block diagram of a communication system in accordance with an embodiment.

FIG. 1 illustrates a simplified block diagram of a communication system (100) according to an embodiment of the present disclosure. The system (100) may include at least two terminals (110, 120) interconnected via a network (150). For unidirectional transmission of data, a first terminal (110) may code video data at a local location for transmission to the other terminal (120) via the network (150). The second terminal (120) may receive the coded video data of the other terminal from the network (150), decode the coded data and display the recovered video data. Unidirectional data transmission may be common in media serving applications and the like.

FIG. 1 illustrates a second pair of terminals (130, 140) provided to support bidirectional transmission of coded video that may occur, for example, during videoconferencing. For bidirectional transmission of data, each terminal (130, 140) may code video data captured at a local location for transmission to the other terminal via the network (150). Each terminal (130, 140) also may receive the coded video data transmitted by the other terminal, may decode the coded data, and may display the recovered video data at a local display device.

In FIG. 1, the terminals (110-140) may be illustrated as servers, personal computers, and smart phones, and/or any other type of terminal. For example, the terminals (110-140) may be laptop computers, tablet computers, media players and/or dedicated video conferencing equipment. The network (150) represents any number of networks that convey coded video data among the terminals (110-140), including for example wireline and/or wireless communication networks. The communication network (150) may exchange data in circuit-switched and/or packet-switched channels. Representative networks include telecommunications networks, local area networks, wide area networks, and/or the Internet. For the purposes of the present discussion, the architecture and topology of the network (150) may be immaterial to the operation of the present disclosure unless explained herein below.

Figure 2:
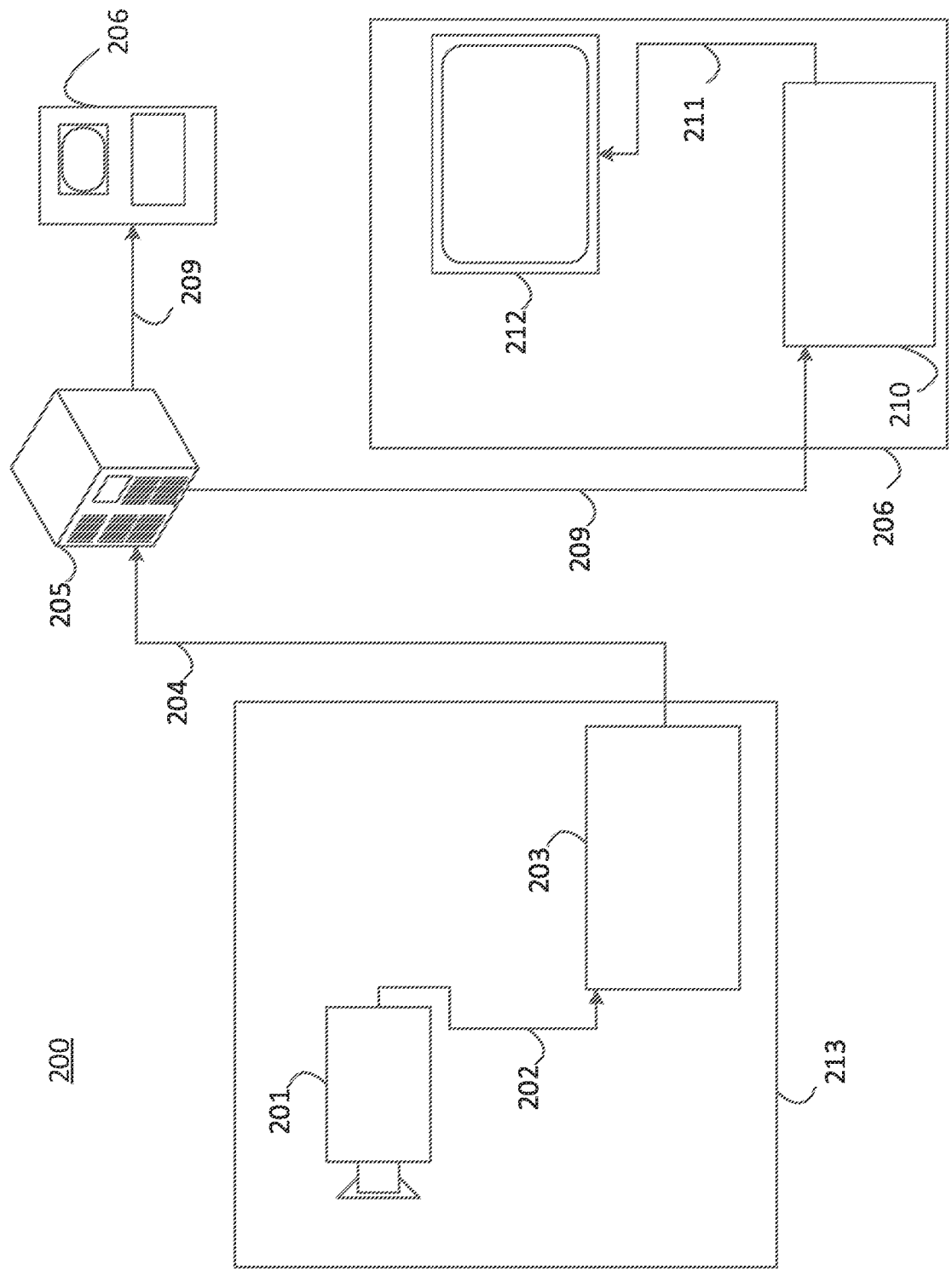
FIG. 2 is a schematic illustration of a simplified block diagram of a communication system in accordance with an embodiment.

FIG. 2 illustrates, as an example for an application for the disclosed subject matter, the placement of a video encoder and decoder in a streaming environment. The disclosed subject matter can be equally applicable to other video enabled applications, including, for example, video conferencing, digital TV, storing of compressed video on digital media including CD, DVD, memory stick and the like, and so on.

As illustrated in FIG. 2, a streaming system (200) may include a capture subsystem (213) that can include a video source (201) and an encoder (203). The video source (201) may be, for example, a digital camera, and may be configured to create an uncompressed video sample stream (202). The uncompressed video sample stream (202) may provide a high data volume when compared to encoded video bitstreams, and can be processed by the encoder (203) coupled to the camera (201). The encoder (203) can include hardware, software, or a combination thereof to enable or implement aspects of the disclosed subject matter as described in more detail below. The encoded video bitstream (204) may include a lower data volume when compared to the sample stream, and can be stored on a streaming server (205) for future use. One or more streaming clients (206) can access the streaming server (205) to retrieve video bit streams (209) that may be copies of the encoded video bitstream (204).

In embodiments, the streaming server (205) may also function as a Media-Aware Network Element (MANE). For example, the streaming server (205) may be configured to prune the encoded video bitstream (204) for tailoring potentially different bitstreams to one or more of the streaming clients (206). In embodiments, a MANE may be separately provided from the streaming server (205) in the streaming system (200).

The streaming clients (206) can include a video decoder (210) and a display (212). The video decoder (210) can, for example, decode video bitstream (209), which is an incoming copy of the encoded video bitstream (204), and create an outgoing video sample stream (211) that can be rendered on the display (212) or another rendering device (not depicted). In some streaming systems, the video bitstreams (204, 209) can be encoded according to certain video coding/compression standards. Examples of such standards include, but are not limited to, ITU-T Recommendation H.265. Under development is a video coding standard informally known as Versatile Video Coding (VVC). Embodiments of the disclosure may be used in the context of VVC.

Figure 3:
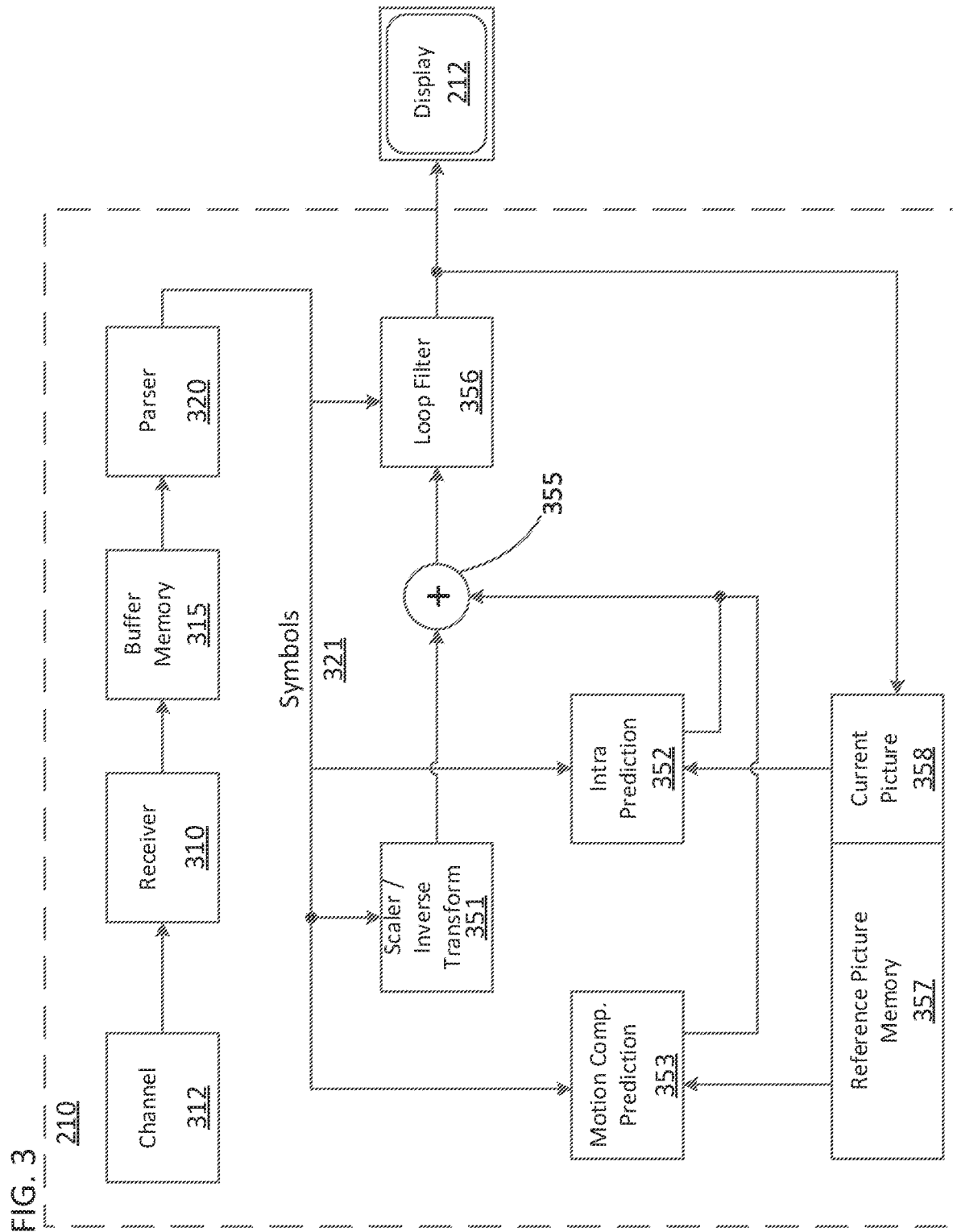
FIG. 3 is a schematic illustration of a simplified block diagram of a decoder in accordance with an embodiment.

FIG. 3 illustrates an example functional block diagram of a video decoder (210) that is attached to a display (212) according to an embodiment of the present disclosure.

The video decoder (210) may include a channel (312), receiver (310), a buffer memory (315), an entropy decoder/parser (320), a scaler/inverse transform unit (351), an intra prediction unit (352), a Motion Compensation Prediction unit (353), an aggregator (355), a loop filter unit (356), reference picture memory (357), and current picture memory ( ) In at least one embodiment, the video decoder (210) may include an integrated circuit, a series of integrated circuits, and/or other electronic circuitry. The video decoder (210) may also be partially or entirely embodied in software running on one or more CPUs with associated memories.

In this embodiment, and other embodiments, the receiver (310) may receive one or more coded video sequences to be decoded by the decoder (210) one coded video sequence at a time, where the decoding of each coded video sequence is independent from other coded video sequences. The coded video sequence may be received from the channel (312), which may be a hardware/software link to a storage device which stores the encoded video data. The receiver (310) may receive the encoded video data with other data, for example, coded audio data and/or ancillary data streams, that may be forwarded to their respective using entities (not depicted). The receiver (310) may separate the coded video sequence from the other data. To combat network jitter, the buffer memory (315) may be coupled in between the receiver (310) and the entropy decoder/parser (320) ("parser" henceforth). When the receiver (310) is receiving data from a store/forward device of sufficient bandwidth and controllability, or from an isosynchronous network, the buffer (315) may not be used, or can be small. For use on best effort packet networks such as the Internet, the buffer (315) may be required, can be comparatively large, and can be of adaptive size.

The video decoder (210) may include a parser (320) to reconstruct symbols (321) from the entropy coded video sequence. Categories of those symbols include, for example, information used to manage operation of the decoder (210), and potentially information to control a rendering device such as a display (212) that may be coupled to a decoder as illustrated in FIG. 2. The control information for the rendering device(s) may be in the form of, for example, Supplementary Enhancement Information (SEI) messages or Video Usability Information (VUI) parameter set fragments (not depicted). The parser (320) may parse/entropy-decode the coded video sequence received. The coding of the coded video sequence can be in accordance with a video coding technology or standard, and can follow principles well known to a person skilled in the art, including variable length coding, Huffman coding, arithmetic coding with or without context sensitivity, and so forth. The parser (320) may extract from the coded video sequence, a set of subgroup parameters for at least one of the subgroups of pixels in the video decoder, based upon at least one parameters corresponding to the group. Subgroups can include Groups of Pictures (GOPs), pictures, tiles, slices, macroblocks, Coding Units (CUs), blocks, Transform Units (TUs), Prediction Units (PUs) and so forth. The parser (320) may also extract from the coded video sequence information such as transform coefficients, quantizer parameter values, motion vectors, and so forth.

The parser (320) may perform entropy decoding/parsing operation on the video sequence received from the buffer (315), so to create symbols (321).

Reconstruction of the symbols (321) can involve multiple different units depending on the type of the coded video picture or parts thereof (such as: inter and intra picture, inter and intra block), and other factors. Which units are involved, and how they are involved, can be controlled by the subgroup control information that was parsed from the coded video sequence by the parser (320). The flow of such subgroup control information between the parser (320) and the multiple units below is not depicted for clarity.

Beyond the functional blocks already mentioned, decoder (210) can be conceptually subdivided into a number of functional units as described below. In a practical implementation operating under commercial constraints, many of these units interact closely with each other and can, at least partly, be integrated into each other. However, for the purpose of describing the disclosed subject matter, the conceptual subdivision into the functional units below is appropriate.

One unit may be the scaler/inverse transform unit (351). The scaler/inverse transform unit (351) may receive quantized transform coefficient as well as control information, including which transform to use, block size, quantization factor, quantization scaling matrices, etc. as symbol(s) (321) from the parser (320). The scaler/inverse transform unit (351) can output blocks including sample values that can be input into the aggregator (355).

In some cases, the output samples of the scaler/inverse transform (351) can pertain to an intra coded block; that is: a block that is not using predictive information from previously reconstructed pictures, but can use predictive information from previously reconstructed parts of the current picture. Such predictive information can be provided by an intra picture prediction unit (352). In some cases, the intra picture prediction unit (352) generates a block of the same size and shape of the block under reconstruction, using surrounding already reconstructed information fetched from the current (partly reconstructed) picture from the current picture memory (358). The aggregator (355), in some cases, adds, on a per sample basis, the prediction information the intra prediction unit (352) has generated to the output sample information as provided by the scaler/inverse transform unit (351).

In other cases, the output samples of the scaler/inverse transform unit (351) can pertain to an inter coded, and potentially motion compensated block. In such a case, a Motion Compensation Prediction unit (353) can access reference picture memory (357) to fetch samples used for prediction. After motion compensating the fetched samples in accordance with the symbols (321) pertaining to the block, these samples can be added by the aggregator (355) to the output of the scaler/inverse transform unit (351) (in this case called the residual samples or residual signal) so to generate output sample information. The addresses within the reference picture memory (357), from which the Motion Compensation Prediction unit (353) fetches prediction samples, can be controlled by motion vectors. The motion vectors may be available to the Motion Compensation Prediction unit (353) in the form of symbols (321) that can have, for example, X, Y, and reference picture components. Motion compensation also can include interpolation of sample values as fetched from the reference picture memory (357) when sub-sample exact motion vectors are in use, motion vector prediction mechanisms, and so forth.

The output samples of the aggregator (355) can be subject to various loop filtering techniques in the loop filter unit (356). Video compression technologies can include in-loop filter technologies that are controlled by parameters included in the coded video bitstream and made available to the loop filter unit (356) as symbols (321) from the parser (320), but can also be responsive to meta-information obtained during the decoding of previous (in decoding order) parts of the coded picture or coded video sequence, as well as responsive to previously reconstructed and loop-filtered sample values.

The output of the loop filter unit (356) can be a sample stream that can be output to a render device such as a display (212), as well as stored in the reference picture memory (357) for use in future inter-picture prediction.

Certain coded pictures, once fully reconstructed, can be used as reference pictures for future prediction. Once a coded picture is fully reconstructed and the coded picture has been identified as a reference picture (by, for example, parser (320)), the current reference picture can become part of the reference picture memory (357), and a fresh current picture memory can be reallocated before commencing the reconstruction of the following coded picture.

The video decoder (210) may perform decoding operations according to a predetermined video compression technology that may be documented in a standard, such as ITU-T Rec. H.265. The coded video sequence may conform to a syntax specified by the video compression technology or standard being used, in the sense that it adheres to the syntax of the video compression technology or standard, as specified in the video compression technology document or standard and specifically in the profiles document therein. Also, for compliance with some video compression technologies or standards, the complexity of the coded video sequence may be within bounds as defined by the level of the video compression technology or standard. In some cases, levels restrict the maximum picture size, maximum frame rate, maximum reconstruction sample rate (measured in, for example megasamples per second), maximum reference picture size, and so on. Limits set by levels can, in some cases, be further restricted through Hypothetical Reference Decoder (HRD) specifications and metadata for HRD buffer management signaled in the coded video sequence.

In an embodiment, the receiver (310) may receive additional (redundant) data with the encoded video. The additional data may be included as part of the coded video sequence(s). The additional data may be used by the video decoder (210) to properly decode the data and/or to more accurately reconstruct the original video data. Additional data can be in the form of, for example, temporal, spatial, or SNR enhancement layers, redundant slices, redundant pictures, forward error correction codes, and so on.

Figure 4:
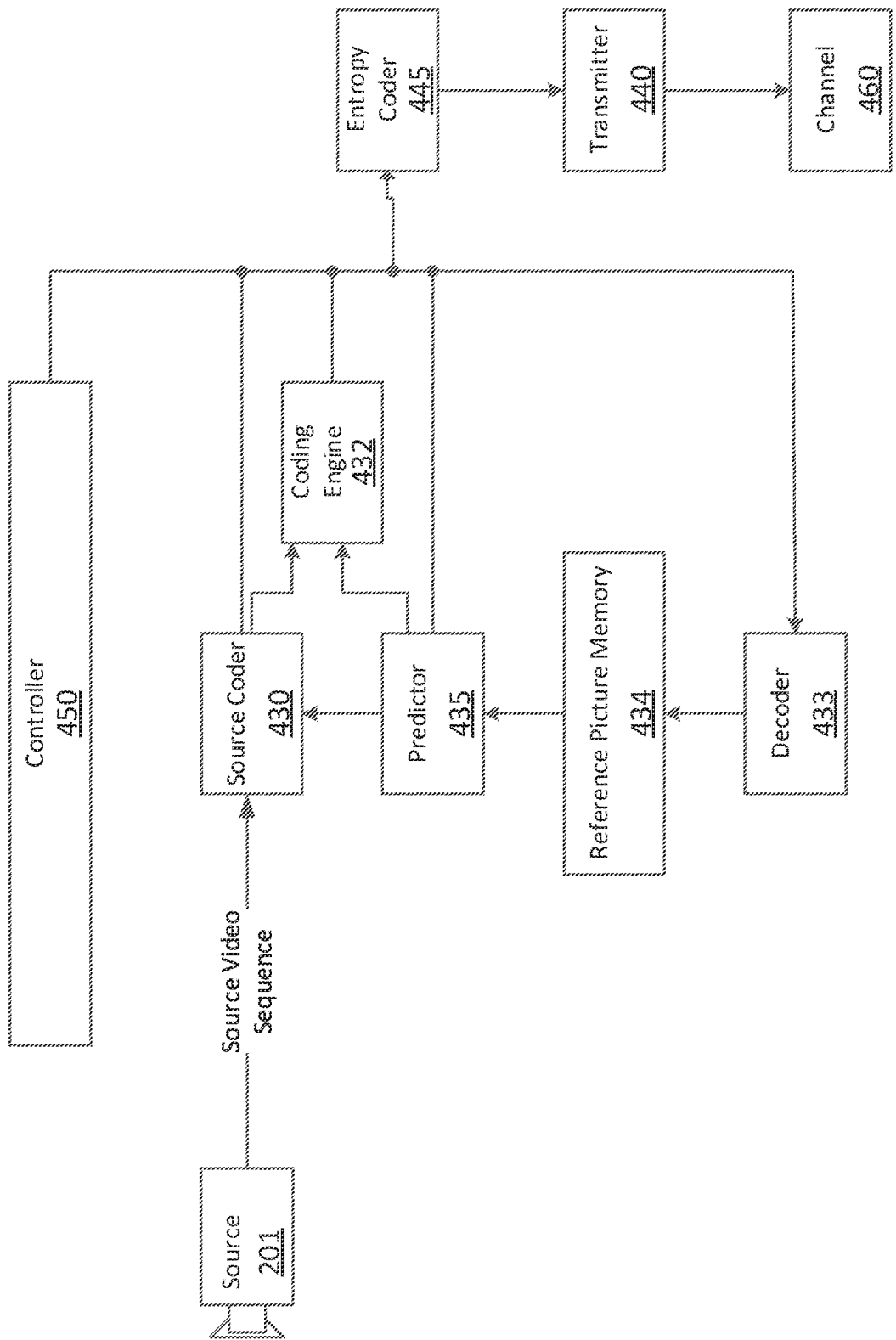
FIG. 4 is a schematic illustration of a simplified block diagram of an encoder in accordance with an embodiment.

FIG. 4 illustrates an example functional block diagram of a video encoder (203) associated with a video source (201) according to an embodiment of the present disclosure.

The video encoder (203) may include, for example, an encoder that is a source coder (430), a coding engine (432), a (local) decoder (433), a reference picture memory (434), a predictor (435), a transmitter (440), an entropy coder (445), a controller (450), and a channel (460).

The encoder (203) may receive video samples from a video source (201) (that is not part of the encoder) that may capture video image(s) to be coded by the encoder (203).

The video source (201) may provide the source video sequence to be coded by the encoder (203) in the form of a digital video sample stream that can be of any suitable bit depth (for example: 8 bit, 10 bit, 12 bit, . . . ), any colorspace (for example, BT.601 Y CrCB, RGB, . . . ) and any suitable sampling structure (for example Y CrCb 4:2:0, Y CrCb 4:4:4). In a media serving system, the video source (201) may be a storage device storing previously prepared video. In a videoconferencing system, the video source (203) may be a camera that captures local image information as a video sequence. Video data may be provided as a plurality of individual pictures that impart motion when viewed in sequence. The pictures themselves may be organized as a spatial array of pixels, wherein each pixel can include one or more sample depending on the sampling structure, color space, etc. in use. A person skilled in the art can readily understand the relationship between pixels and samples. The description below focuses on samples.

According to an embodiment, the encoder (203) may code and compress the pictures of the source video sequence into a coded video sequence (443) in real time or under any other time constraints as required by the application. Enforcing appropriate coding speed is one function of controller (450). The controller (450) may also control other functional units as described below and may be functionally coupled to these units. The coupling is not depicted for clarity. Parameters set by the controller (450) can include rate control related parameters (picture skip, quantizer, lambda value of rate-distortion optimization techniques, . . . ), picture size, group of pictures (GOP) layout, maximum motion vector search range, and so forth. A person skilled in the art can readily identify other functions of controller (450) as they may pertain to video encoder (203) optimized for a certain system design.

Some video encoders operate in what a person skilled in the are readily recognizes as a "coding loop". As an oversimplified description, a coding loop can consist of the encoding part of the source coder (430) (responsible for creating symbols based on an input picture to be coded, and a reference picture(s)), and the (local) decoder (433) embedded in the encoder (203) that reconstructs the symbols to create the sample data that a (remote) decoder also would create when a compression between symbols and coded video bitstream is lossless in certain video compression technologies. That reconstructed sample stream may be input to the reference picture memory (434). As the decoding of a symbol stream leads to bit-exact results independent of decoder location (local or remote), the reference picture memory content is also bit exact between a local encoder and a remote encoder. In other words, the prediction part of an encoder "sees" as reference picture samples exactly the same sample values as a decoder would "see" when using prediction during decoding. This fundamental principle of reference picture synchronicity (and resulting drift, if synchronicity cannot be maintained, for example because of channel errors) is known to a person skilled in the art.

The operation of the "local" decoder (433) can be the same as of a "remote" decoder (210), which has already been described in detail above in conjunction with FIG. 3. However, as symbols are available and en/decoding of symbols to a coded video sequence by the entropy coder (445) and the parser (320) can be lossless, the entropy decoding parts of decoder (210), including channel (312), receiver (310), buffer (315), and parser (320) may not be fully implemented in the local decoder (433).

An observation that can be made at this point is that any decoder technology, except the parsing/entropy decoding that is present in a decoder, may need to be present, in substantially identical functional form in a corresponding encoder. For this reason, the disclosed subject matter focuses on decoder operation. The description of encoder technologies can be abbreviated as they may be the inverse of the comprehensively described decoder technologies. Only in certain areas a more detail description is required and provided below.

As part of its operation, the source coder (430) may perform motion compensated predictive coding, which codes an input frame predictively with reference to one or more previously-coded frames from the video sequence that were designated as "reference frames." In this manner, the coding engine (432) codes differences between pixel blocks of an input frame and pixel blocks of reference frame(s) that may be selected as prediction reference(s) to the input frame.

The local video decoder (433) may decode coded video data of frames that may be designated as reference frames, based on symbols created by the source coder (430). Operations of the coding engine (432) may advantageously be lossy processes. When the coded video data may be decoded at a video decoder (not shown in FIG. 4), the reconstructed video sequence typically may be a replica of the source video sequence with some errors. The local video decoder (433) replicates decoding processes that may be performed by the video decoder on reference frames and may cause reconstructed reference frames to be stored in the reference picture memory (434). In this manner, the encoder (203) may store copies of reconstructed reference frames locally that have common content as the reconstructed reference frames that will be obtained by a far-end video decoder (absent transmission errors).

The predictor (435) may perform prediction searches for the coding engine (432). That is, for a new frame to be coded, the predictor (435) may search the reference picture memory (434) for sample data (as candidate reference pixel blocks) or certain metadata such as reference picture motion vectors, block shapes, and so on, that may serve as an appropriate prediction reference for the new pictures. The predictor (435) may operate on a sample block-by-pixel block basis to find appropriate prediction references. In some cases, as determined by search results obtained by the predictor (435), an input picture may have prediction references drawn from multiple reference pictures stored in the reference picture memory (434).

The controller (450) may manage coding operations of the video coder (430), including, for example, setting of parameters and subgroup parameters used for encoding the video data.

Output of all aforementioned functional units may be subjected to entropy coding in the entropy coder (445). The entropy coder translates the symbols as generated by the various functional units into a coded video sequence, by loss-less compressing the symbols according to technologies known to a person skilled in the art as, for example Huffman coding, variable length coding, arithmetic coding, and so forth.

The transmitter (440) may buffer the coded video sequence(s) as created by the entropy coder (445) to prepare it for transmission via a communication channel (460), which may be a hardware/software link to a storage device which would store the encoded video data. The transmitter (440) may merge coded video data from the video coder (430) with other data to be transmitted, for example, coded audio data and/or ancillary data streams (sources not shown).

The controller (450) may manage operation of the encoder (203). During coding, the controller (450) may assign to each coded picture a certain coded picture type, which may affect the coding techniques that may be applied to the respective picture. For example, pictures often may be assigned as an Intra Picture (I picture), a Predictive Picture (P picture), or a Bi-directionally Predictive Picture (B Picture).

An Intra Picture (I picture) may be one that may be coded and decoded without using any other frame in the sequence as a source of prediction. Some video codecs allow for different types of Intra pictures, including, for example Independent Decoder Refresh (IDR) Pictures. A person skilled in the art is aware of those variants of I pictures and their respective applications and features.

A Predictive picture (P picture) may be one that may be coded and decoded using intra prediction or inter prediction using at most one motion vector and reference index to predict the sample values of each block.

A Bi-directionally Predictive Picture (B Picture) may be one that may be coded and decoded using intra prediction or inter prediction using at most two motion vectors and reference indices to predict the sample values of each block. Similarly, multiple-predictive pictures can use more than two reference pictures and associated metadata for the reconstruction of a single block.

Source pictures commonly may be subdivided spatially into a plurality of sample blocks (for example, blocks of 4×4, 8×8, 4×8, or 16×16 samples each) and coded on a block-by-block basis. Blocks may be coded predictively with reference to other (already coded) blocks as determined by the coding assignment applied to the blocks' respective pictures. For example, blocks of I pictures may be coded non-predictively or they may be coded predictively with reference to already coded blocks of the same picture (spatial prediction or intra prediction). Pixel blocks of P pictures may be coded non-predictively, via spatial prediction or via temporal prediction with reference to one previously coded reference pictures. Blocks of B pictures may be coded non-predictively, via spatial prediction or via temporal prediction with reference to one or two previously coded reference pictures.

The video coder (203) may perform coding operations according to a predetermined video coding technology or standard, such as ITU-T Rec. H.265. In its operation, the video coder (203) may perform various compression operations, including predictive coding operations that exploit temporal and spatial redundancies in the input video sequence. The coded video data, therefore, may conform to a syntax specified by the video coding technology or standard being used.

In an embodiment, the transmitter (440) may transmit additional data with the encoded video. The video coder (430) may include such data as part of the coded video sequence. Additional data may comprise temporal/spatial/SNR enhancement layers, other forms of redundant data such as redundant pictures and slices, Supplementary Enhancement Information (SEI) messages, Visual Usability Information (VUI) parameter set fragments, and so on.

Before describing certain aspects of embodiments of the disclosure in more detail, a few terms are introduced below that are referred to in the remainder of this description.

"Sub-Picture" henceforth refers to, in some cases, a rectangular arrangement of samples, blocks, macroblocks, coding units, or similar entities that are semantically grouped, and that may be independently coded in changed resolution. One or more sub-pictures may form a picture. One or more coded sub-pictures may form a coded picture. One or more sub-pictures may be assembled into a picture, and one or more sub pictures may be extracted from a picture. In certain environments, one or more coded sub-pictures may be assembled in the compressed domain without transcoding to the sample level into a coded picture, and in the same or certain other cases, one or more coded sub-pictures may be extracted from a coded picture in the compressed domain.

"Adaptive Resolution Change" (ARC) henceforth refers to mechanisms that allow the change of resolution of a picture or sub-picture within a coded video sequence, by the means of, for example, reference picture resampling. "ARC parameters" henceforth refer to the control information required to perform adaptive resolution change, that may include, for example, filter parameters, scaling factors, resolutions of output and/or reference pictures, various control flags, and so forth.

According to embodiments of the present disclosure, the size of CTUs located in the first row (and/or column) of a picture can be smaller than the size of the CTUs located in the second row (and/or column) of the picture, and the size of the CTUs may be the same except those located at the top, bottom, left, and/or right picture boundaries.

Figure 12:
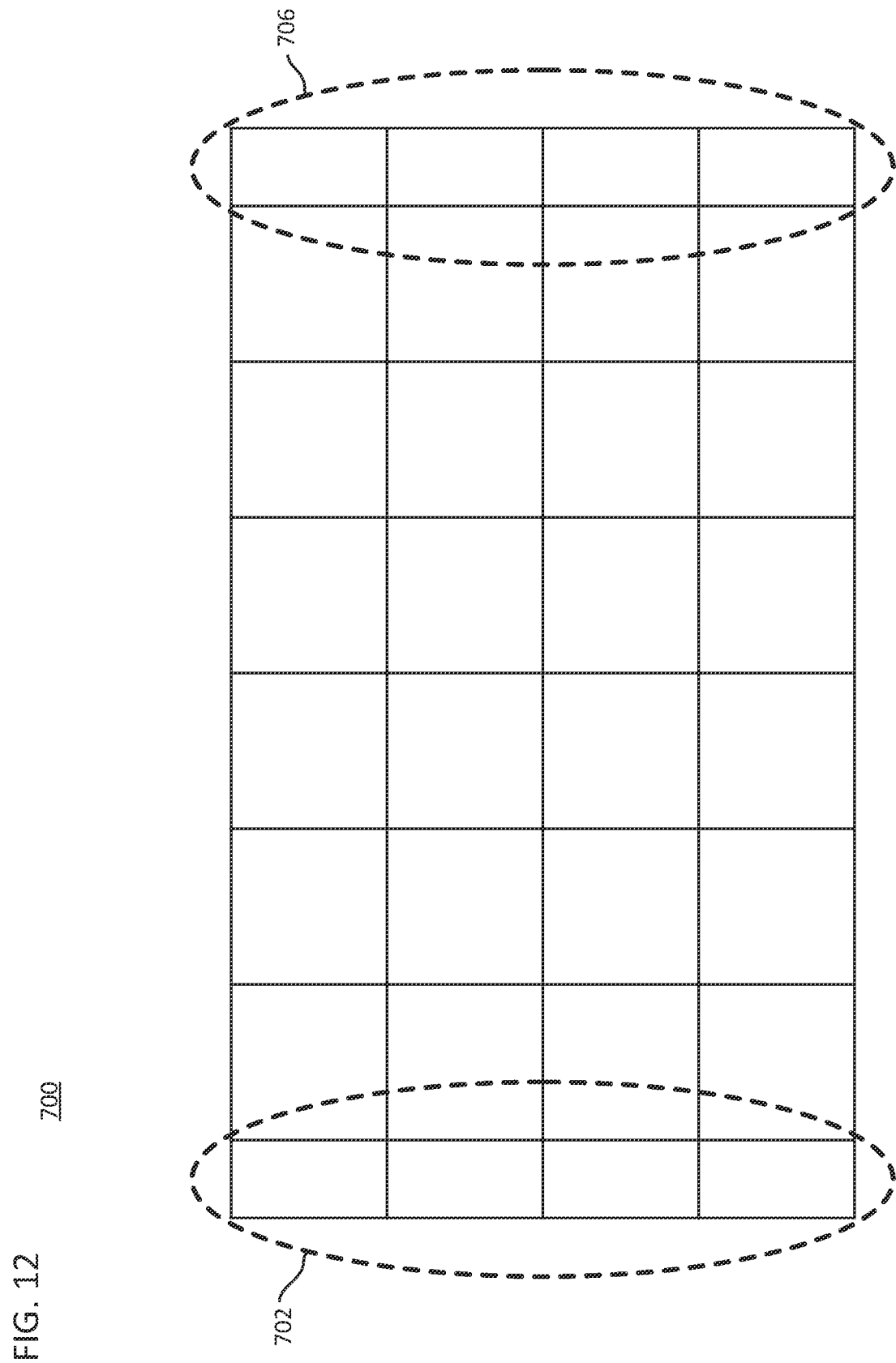
FIG. 12 is a diagram illustrating a picture divided into a plurality of CTUs according to an embodiment of the present disclosure.
Figure 13:
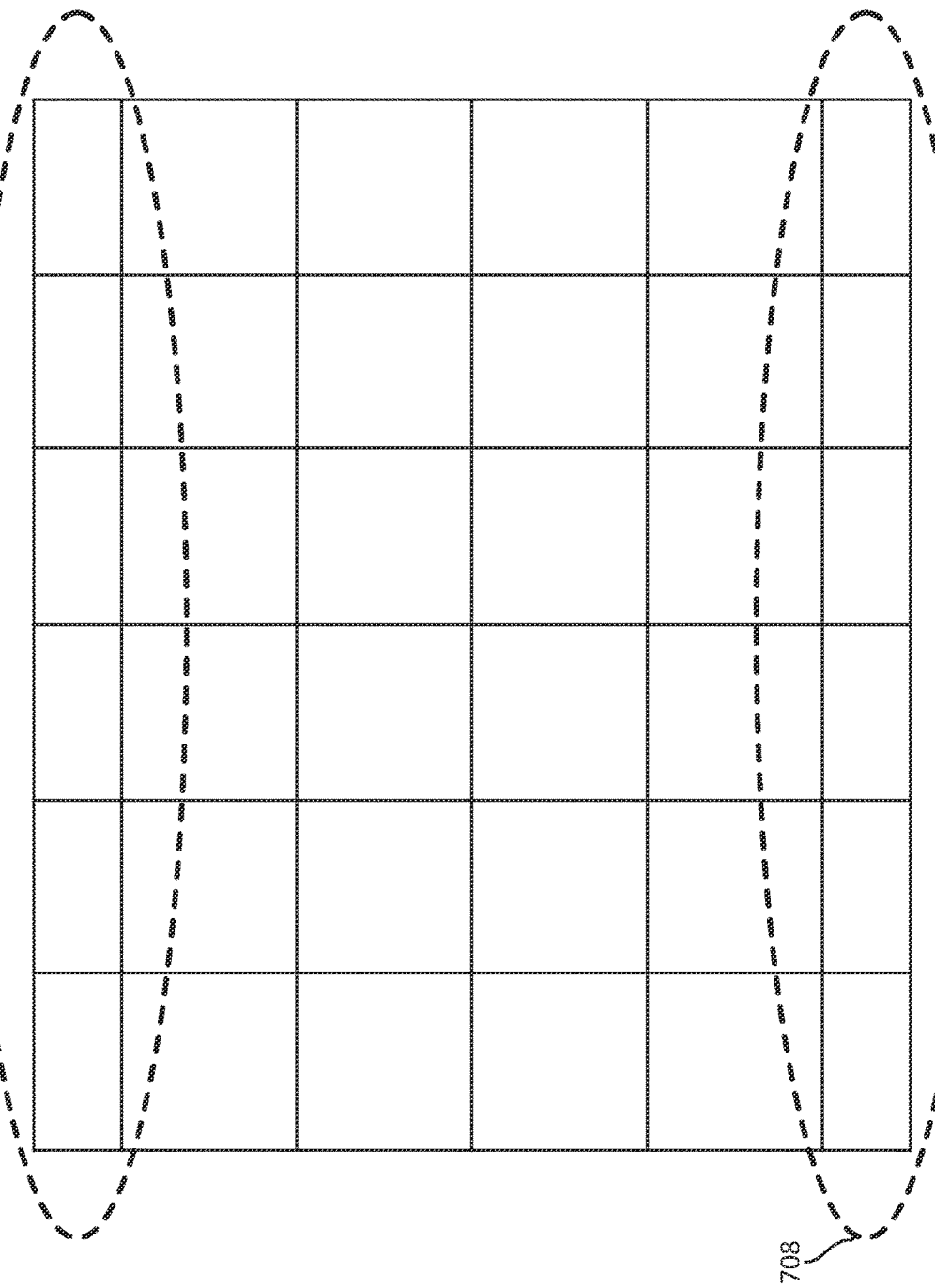
FIG. 13 is a diagram illustrating a picture divided into a plurality of CTUs according to an embodiment of the present disclosure.
Figure 14:
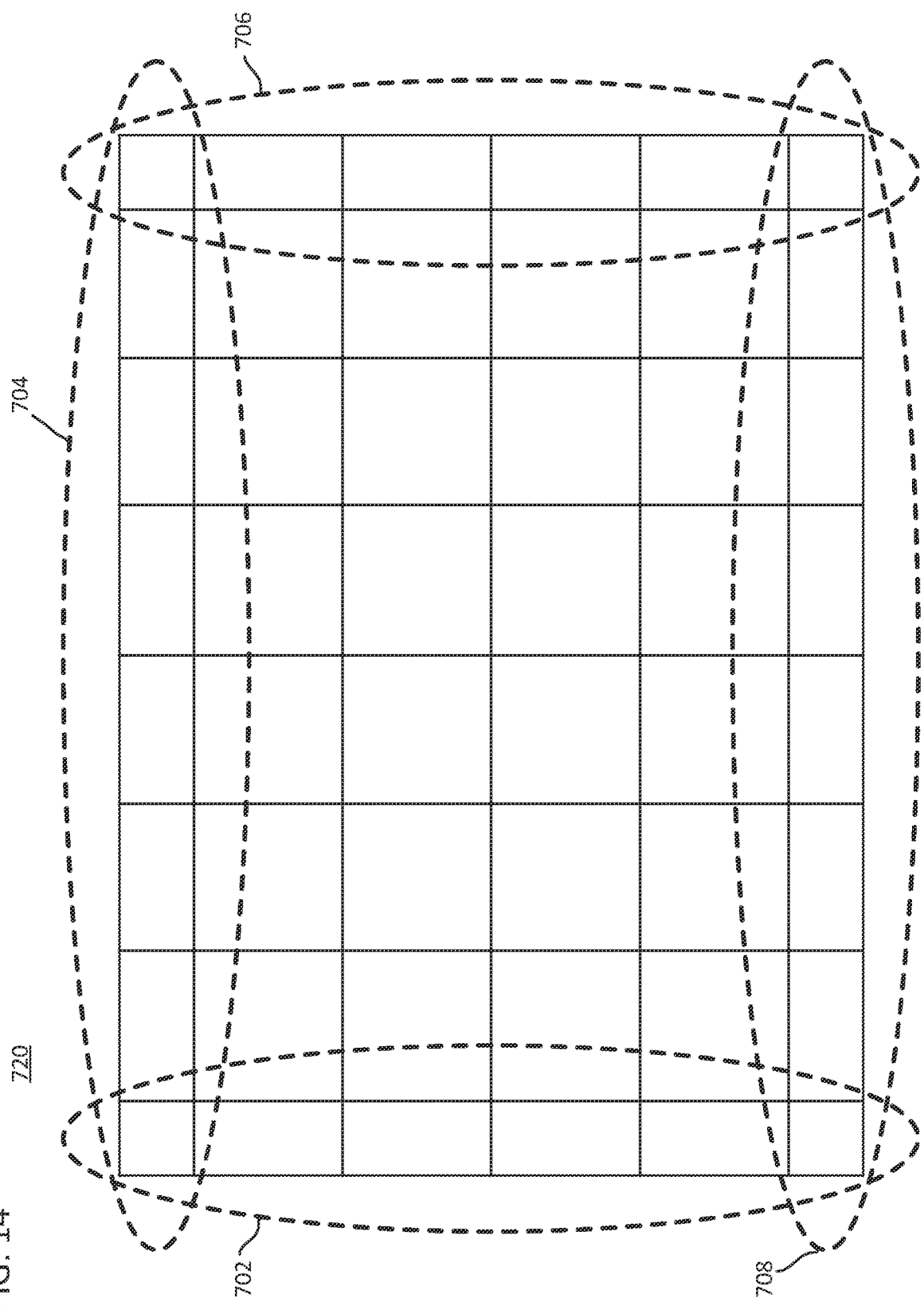
FIG. 14 is a diagram illustrating a picture divided into a plurality of CTUs according to an embodiment of the present disclosure.
Figure 15:
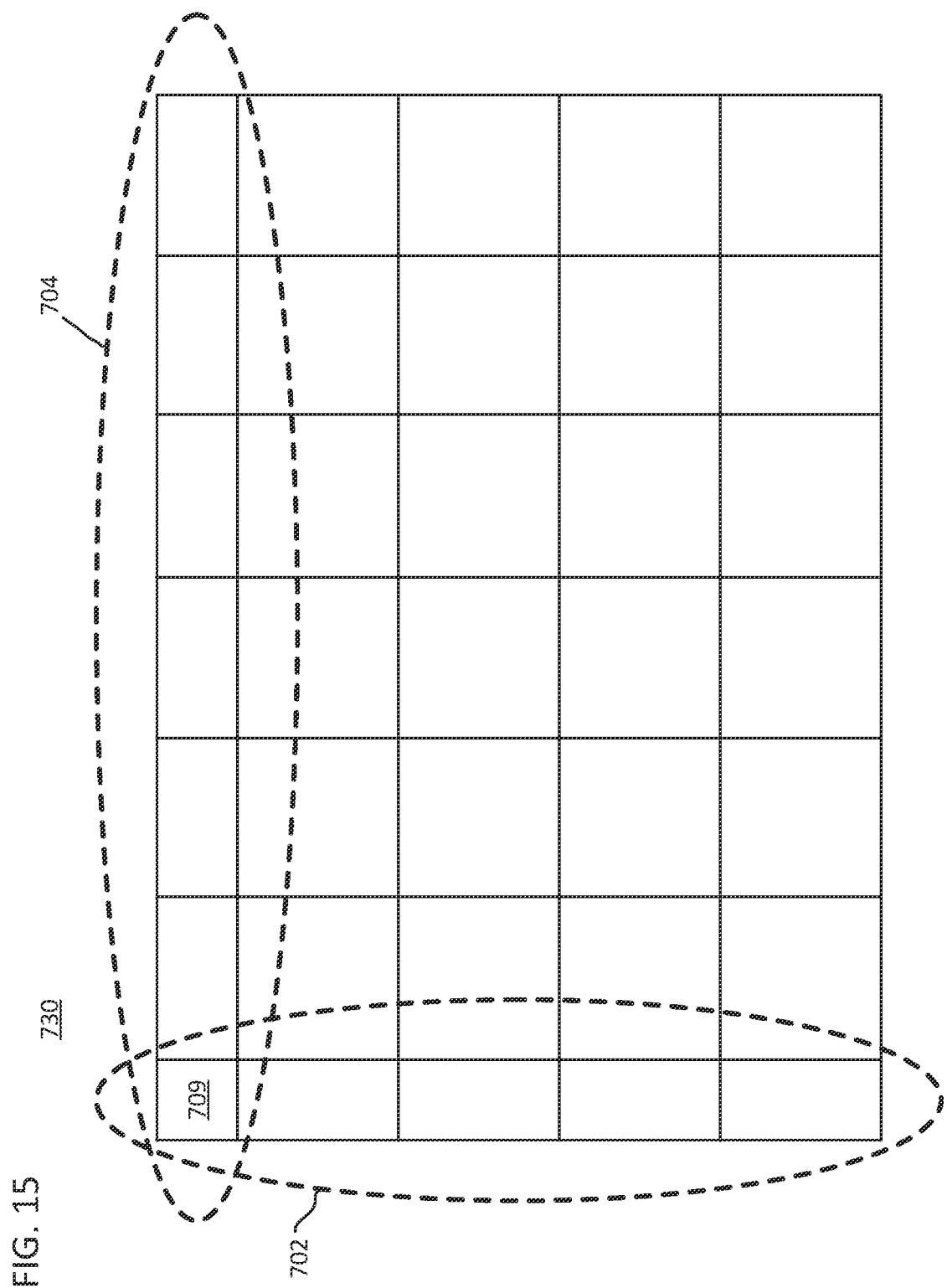
FIG. 15 is a diagram illustrating a picture divided into a plurality of CTUs according to an embodiment of the present disclosure.

For example, with reference to FIGS. 12-15, pictures (700), (710), (720), and (730) may be partitioned into a plurality of CTUs in accordance with embodiments of the present disclosure. In FIG. 12, CTUs located in the first CTU column (702) and last CTU column (706) of the picture (700) may have a smaller size than the CTUs located in the other columns of the picture (700), and the CTUs located in the other columns may have a same size as each other. In FIG. 13, CTUs located in the first CTU row (704) and the last CTU row (708) of the picture (710) may have a smaller size than the CTUs located in the other rows of the picture (710), and the CTUs located in the other rows may have a same size as each other. In FIG. 14, CTUs located in the first CTU row (704), the first CTU column (702), the last CTU row (708), and the last CTU column (706) of the picture (720) may have a smaller size than the CTUs located in the other rows/columns of the picture (720), and the CTUs located in the other rows/columns may have a same size as each other. In FIG. 15, CTUs located in the first CTU row (704) and the first CTU column (702) may have a smaller size than the CTUs located in the other rows/columns of the picture (730), and the CTUs located in the other rows/columns may have a same size as each other.

In one or more embodiments, the width and/or height of the first CTU row and/or column is signaled in High-Level Syntax (HLS) in the bitstream, such as sequence parameter set (SPS), picture parameter set (PPS), or slice header.

In one embodiment, the width and/or height of the first CTU row and/or column may be signaled by using fixed length coding or truncated binary or truncated unary coding.

In another embodiment, one flag is firstly signaled to indicate whether the width (and/or height) of the first CTU row (and/or column) is equal to the maximum allowed CTU size or not. If the one flag indicates that the width (and/or height) is not equal to the maximum allowed CTU size, a second flag may be further signaled to indicate the width (and/or height) of the first CTU row (and/or column). In one example, fixed length coding may be used for the signaling of second flag.

In one embodiment, the width (and/or height) of first CTU row (and/or column) is restricted to power of 2, and the width (and/or height) of the first CTU row (and/or column) may be equal to or greater than K1, wherein K1 may be a positive integer, such as 2, 4, 6, 8, etc, or may be a power of 2. For example, the height of the first CTU row may be restricted and/or the width of the first CTU column may be restricted.

In another embodiment, the width (and/or height) of first CTU row (and/or column) may be restricted to be an integer multiple of K2, wherein K2 is an even integer, such as 2, 4, 6, 8, 10, 12, 14, 16, etc. For example, the height of the first CTU row may be restricted and/or the width of the first CTU column may be restricted. In one embodiment, K2 may be further restricted to be a power of 2. In one embodiment, in order to ensure the width and height of each coded block is a power of 2, the same boundary handling rules for the last CTU row may be applied to the first CTU row, and the same boundary handling rules for the last CTU column may be applied to the first CTU column.

In one or more embodiments, when the width (and/or height) of the first CTU row (and/or column) is equal to or larger than K3, and the height (and/or width) of the first CTU row (and/or column) is smaller than K3, then horizontal (and/or vertical) split is not allowed at CTU level in the first CTU row (and/or column). K3 may be a power of 2 value and K3 may be greater than 64, such as 128 or 256. For example, according to an embodiment, when the width of the first CTU row (704) is equal to or larger than K3 and the height of the first CTU row (704) is smaller than K3, then horizontal split may be prohibited at CTU level for the first CTU row (704). Alternatively or additionally, when the height of the first CTU column (702) is equal to or larger than K3 and the width of the first CTU column (702) is smaller than K3, then vertical split may not be prohibited at CTU level for the first CTU column (702). In a case where the above conditions for the first CTU row (704) and the first CTU column (702) are respectively true, horizontal and vertical split of a corner CTU (709) (see FIG. 15) may be prohibited. Similarly, horizontal and vertical split of any other corner CTU may be prohibited when the CTU row and column in which the other corner CTU is provided meets the above conditions.

In one or more embodiments, when the width (and/or height) of the first CTU row (and/or column) is equal to or larger than K3, and the height (and/or width) of the first CTU row (and/or column) is smaller than K3, then vertical TT (and/or horizontal TT) split may not be allowed at CTU level in the first CTU row (and/or column). K3 may be a power of 2 value and K3 may be greater than 64, such as 128 or 256. For example, according to an embodiment, when the width of the first CTU row (704) is equal to or larger than K3 and the height of the first CTU row (704) is smaller than K3, then horizontal TT split may be prohibited at CTU level for the first CTU row (704). Alternatively or additionally, when the height of the first CTU column (702) is equal to or larger than K3 and the width of the first CTU column (702) is smaller than K3, then vertical TT split may be prohibited at CTU level for the first CTU column (702). In a case where the above conditions for the first CTU row (704) and the first CTU column (702) are respectively true, horizontal and vertical TT split of a corner CTU (709) (see FIG. 15) may be prohibited. Similarly, horizontal and vertical TT split of any other corner CTU may be prohibited when the CTU row and column in which the other corner CTU is provided meets the above conditions.

In one or more embodiments, only the height (and/or width) of the first or last CTU rows (and/or columns) of a picture can be smaller than the maximum CTU size, the size of other CTU rows (and/or columns) of the picture may be the same as the maximum CTU size. For example, as shown in FIG. 14, the height of the first CTU row (704) and the width of the first CTU column (702) of the picture (740) may be smaller than the maximum CTU size, and the other rows/columns of the picture (720) may be equal to the maximum CTU size.

In an embodiment, one flag is signaled in High-Level Syntax (HLS) in the bitstream, such as sequence parameter set (SPS), picture parameter set (PPS), or slice header, to indicate whether the first and/or last CTU row (and/or column) has a smaller size than other CTU rows (and/or columns).

Embodiments of the present disclosure described above may apply to specified color components only (e.g., luma only, chroma only), or apply to different color components differently (e.g., different sizes of first CTU row or CTU column can be applied for different color components).

According to embodiments, the width of the first CTU column may be derived by the decoder from other remaining CTUs. According to embodiments, an encoder may specify the size of the first CTU column (and/or row) and/or middle column(s) (and or row(s)) to the decoder, and the decoder may derive a size of the last CTU column (and/or row) based on the size(s) specified.

Embodiments of the present disclosure may comprise at least one processor and memory storing computer instructions. The computer instructions, when executed by the at least one processor, may be configured to cause the at least one processor to perform the functions of the embodiments of the present disclosure.

Figure 16:
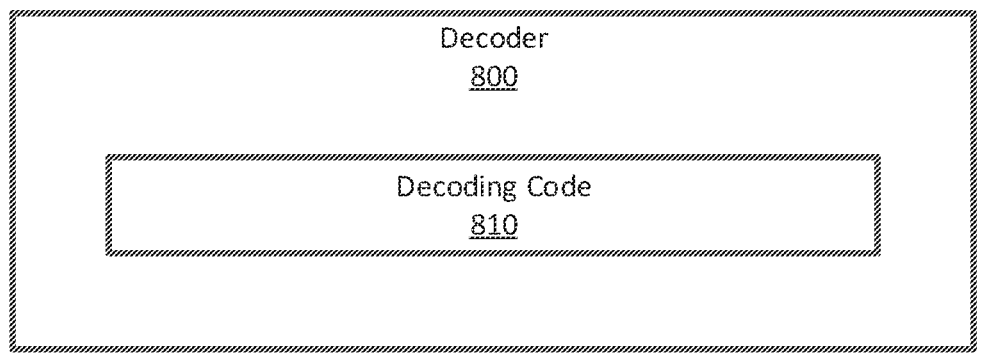
FIG. 16 is a schematic diagram of a decoder according to an embodiment of the present disclosure.

For example, with reference to FIG. 16, a decoder (800) of the present disclosure may comprise at least one processor and memory storing computer instructions. The computer instructions may comprise decoding code (810). The decoder (800) may implement the video decoder (210) illustrated in FIGS. 2-3.

The decoding code (810) may be configured to cause the at least one processor to decode a coded picture that is partitioned into a plurality of CTUs, wherein the decoding code (810) may be configured to cause the at least one processor to decode the coded picture based on the plurality of CTUs.

The CTUs may have any of the CTU configurations of embodiments described in the present disclosure such as, for example, with respect to FIGS. 12-15. For example, at least one row or column of CTUs, among the plurality of CTUs of the coded picture, that is adjacent to a boundary of the coded picture may have a size dimension that is smaller than a corresponding size dimension of each CTU among the plurality of CTUs that is not adjacent to any boundary of the coded picture.

The decoding code (810) may be further configured to cause the at least one processor to signal flags in accordance with embodiments of the present disclosure. For example, the decoding code (810) may be configured to cause the at least one processor to signal the size dimension of a first row and/or column, from among the least one row or column of CTUs, that is adjacent to the top boundary or the left boundary of the coded picture. Alternatively, the decoding code (810) may be configured to cause the at least one processor to: signal a first flag that indicates whether the size dimension of a first row and/or column, from among the least one row or column of CTUs, that is adjacent to the left boundary or the top boundary of the coded picture is equal to a maximum allowed CTU size; determine, based on the first flag, that the size dimension of the first row and/or column of CTUs is not equal to the maximum allowed CTU size; and signal, based on the determining, a second flag that indicates the size dimension of the first row and/or column of CTUs.

The decoding code (810) may be further configured to cause the at least one processor to disallow horizontal or vertical splitting at CTU level and/or disallow horizontal triple tree (TT) or vertical TT splitting based on the disallowance conditions of embodiments described in the present disclosure. For example, the decoding code (810) may be configured to cause the at least one processor to disallow horizontal or vertical splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64. Alternatively or additionally, the decoding code (810) may be configured to cause the at least one processor to disallow horizontal triple tree (TT) or vertical TT splitting at CTU level in the first CTU row or the first CTU column of the coded picture, from among the least one row or column of CTUs, based on determining that the size dimension of the first CTU row or the first CTU column is equal to or larger than a predetermined value and another size dimension of the first CTU row or the first CTU column from among the least one row or column of CTUs is smaller than the predetermined value, wherein the size dimension is one from among height and width, and the another size dimension is the other from among the height and the width, and the predetermined value is a power of 2 value that is greater than 64.

According to embodiments, the decoding code (810) may also be configured to cause the at least one processor to partition the coded picture into the plurality of CTUs.

According to embodiments, the encoder-side processes corresponding to the above processes may be implemented by encoding code for encoding a picture as would be understood by a person of ordinary skill in the art, based on the above descriptions.

The techniques of embodiments of the present disclosure described above, can be implemented as computer software using computer-readable instructions and physically stored in one or more computer-readable media. For example, FIG. 17 shows a computer system (900) suitable for implementing embodiments of the disclosed subject matter.

The computer software can be coded using any suitable machine code or computer language, that may be subject to assembly, compilation, linking, or like mechanisms to create code comprising instructions that can be executed directly, or through interpretation, micro-code execution, and the like, by computer central processing units (CPUs), Graphics Processing Units (GPUs), and the like.

The instructions can be executed on various types of computers or components thereof, including, for example, personal computers, tablet computers, servers, smartphones, gaming devices, internet of things devices, and the like.

The components shown in FIG. 17 for computer system (900) are exemplary in nature and are not intended to suggest any limitation as to the scope of use or functionality of the computer software implementing embodiments of the present disclosure. Neither should the configuration of components be interpreted as having any dependency or requirement relating to any one or combination of components illustrated in the exemplary embodiment of a computer system (900).

Computer system (900) may include certain human interface input devices. Such a human interface input device may be responsive to input by one or more human users through, for example, tactile input (such as: keystrokes, swipes, data glove movements), audio input (such as: voice, clapping), visual input (such as: gestures), olfactory input (not depicted). The human interface devices can also be used to capture certain media not necessarily directly related to conscious input by a human, such as audio (such as: speech, music, ambient sound), images (such as: scanned images, photographic images obtain from a still image camera), video (such as two-dimensional video, three-dimensional video including stereoscopic video).

Input human interface devices may include one or more of (only one of each depicted): keyboard (901), mouse (902), trackpad (903), touch screen (910), data-glove, joystick (905), microphone (906), scanner (907), and camera (908).

Computer system (900) may also include certain human interface output devices. Such human interface output devices may be stimulating the senses of one or more human users through, for example, tactile output, sound, light, and smell/taste. Such human interface output devices may include tactile output devices (for example tactile feedback by the touch-screen (910), data-glove, or joystick (905), but there can also be tactile feedback devices that do not serve as input devices). For example, such devices may be audio output devices (such as: speakers (909), headphones (not depicted)), visual output devices (such as screens (910) to include CRT screens, LCD screens, plasma screens, OLED screens, each with or without touch-screen input capability, each with or without tactile feedback capability—some of which may be capable to output two dimensional visual output or more than three dimensional output through means such as stereographic output; virtual-reality glasses (not depicted), holographic displays and smoke tanks (not depicted)), and printers (not depicted).

Computer system (900) can also include human accessible storage devices and their associated media such as optical media including CD/DVD ROM/RW (920) with CD/DVD or the like media (921), thumb-drive (922), removable hard drive or solid state drive (923), legacy magnetic media such as tape and floppy disc (not depicted), specialized ROM/ASIC/PLD based devices such as security dongles (not depicted), and the like.

Those skilled in the art should also understand that term "computer readable media" as used in connection with the presently disclosed subject matter does not encompass transmission media, carrier waves, or other transitory signals.

Computer system (900) can also include interface to one or more communication networks. Networks can for example be wireless, wireline, optical. Networks can further be local, wide-area, metropolitan, vehicular and industrial, real-time, delay-tolerant, and so on. Examples of networks include local area networks such as Ethernet, wireless LANs, cellular networks to include GSM, 3G, 4G, 5G, LTE and the like, TV wireline or wireless wide area digital networks to include cable TV, satellite TV, and terrestrial broadcast TV, vehicular and industrial to include CANBus, and so forth. Certain networks commonly require external network interface adapters that attached to certain general purpose data ports or peripheral buses (949) (such as, for example USB ports of the computer system (900); others are commonly integrated into the core of the computer system 900 by attachment to a system bus as described below (for example Ethernet interface into a PC computer system or cellular network interface into a smartphone computer system). Using any of these networks, computer system (900) can communicate with other entities. Such communication can be uni-directional, receive only (for example, broadcast TV), uni-directional send-only (for example CANbus to certain CANbus devices), or bi-directional, for example to other computer systems using local or wide area digital networks. Such communication can include communication to a cloud computing environment (955). Certain protocols and protocol stacks can be used on each of those networks and network interfaces as described above.

Aforementioned human interface devices, human-accessible storage devices, and network interfaces (954) can be attached to a core (940) of the computer system (900).

The core (940) can include one or more Central Processing Units (CPU) (941), Graphics Processing Units (GPU) (942), specialized programmable processing units in the form of Field Programmable Gate Areas (FPGA) (943), hardware accelerators (944) for certain tasks, and so forth. These devices, along with Read-only memory (ROM) (945), Random-access memory (946), internal mass storage such as internal non-user accessible hard drives, SSDs, and the like (947), may be connected through a system bus (948). In some computer systems, the system bus (948) can be accessible in the form of one or more physical plugs to enable extensions by additional CPUs, GPU, and the like. The peripheral devices can be attached either directly to the core's system bus (948), or through a peripheral bus (949). Architectures for a peripheral bus include PCI, USB, and the like. A graphics adapter (950) may be included in the core (940).

CPUs (941), GPUs (942), FPGAs (943), and accelerators (944) can execute certain instructions that, in combination, can make up the aforementioned computer code. That computer code can be stored in ROM (945) or RAM (946). Transitional data can be also be stored in RAM (946), whereas permanent data can be stored for example, in the internal mass storage (947). Fast storage and retrieve to any of the memory devices can be enabled through the use of cache memory, that can be closely associated with one or more CPU (941), GPU (942), mass storage (947), ROM (945), RAM (946), and the like.

The computer readable media can have computer code thereon for performing various computer-implemented operations. The media and computer code can be those specially designed and constructed for the purposes of the present disclosure, or they can be of the kind well known and available to those having skill in the computer software arts.

As an example and not by way of limitation, the computer system having architecture (900), and specifically the core (940) can provide functionality as a result of processor(s) (including CPUs, GPUs, FPGA, accelerators, and the like) executing software embodied in one or more tangible, computer-readable media. Such computer-readable media can be media associated with user-accessible mass storage as introduced above, as well as certain storage of the core (940) that are of non-transitory nature, such as core-internal mass storage (947) or ROM (945). The software implementing various embodiments of the present disclosure can be stored in such devices and executed by core (940). A computer-readable medium can include one or more memory devices or chips, according to particular needs. The software can cause the core (940) and specifically the processors therein (including CPU, GPU, FPGA, and the like) to execute particular processes or particular parts of particular processes described herein, including defining data structures stored in RAM (946) and modifying such data structures according to the processes defined by the software. In addition or as an alternative, the computer system can provide functionality as a result of logic hardwired or otherwise embodied in a circuit (for example:

accelerator (944)), which can operate in place of or together with software to execute particular processes or particular parts of particular processes described herein. Reference to software can encompass logic, and vice versa, where appropriate. Reference to a computer-readable media can encompass a circuit (such as an integrated circuit (IC)) storing software for execution, a circuit embodying logic for execution, or both, where appropriate. The present disclosure encompasses any suitable combination of hardware and software.

While this disclosure has described several non-limiting example embodiments, there are alterations, permutations, and various substitute equivalents, which fall within the scope of the disclosure. It will thus be appreciated that those skilled in the art will be able to devise numerous systems and methods which, although not explicitly shown or described herein, embody the principles of the disclosure and are thus within the spirit and scope thereof.

What is claimed is:

1. A method for video decoding in a decoder, the method comprising:
   receiving a video bitstream comprising a coded picture that is partitioned into a plurality of coding tree units (CTUs); and
   decoding the coded picture based on the plurality of CTUS,
   wherein a first size of CTUs in at least one of (1) a first row adjacent to a top boundary of the coded picture and (2) a first column adjacent to a left boundary of the coded picture is signaled in a high-level syntax (HLS) of the video bistream and is smaller than a second size of CTUs in rows or columns neither adjacent to the top boundary nor adjacent to the left boundary of the coded picture,
   wherein at least one row or column of CTUs, among the plurality of CTUs of the coded picture, is adjacent to a boundary of the coded picture and has a size dimension that is smaller than a corresponding size dimension of each CTU among the plurality of CTUs that is not adjacent to any boundary of the coded picture, and
   wherein:
      the at least one row or column of CTUs includes the first column and a last column that is adjacent to a right boundary of the coded picture, and the first column and the last column each have a width that is smaller than a width of each CTU among the plurality of CTUs that is not adjacent to any boundary of the coded picture, or
      the at least one row or column of CTUs includes the first row and a last row that is adjacent to a bottom boundary of the coded picture, and the first row and the last row each have a height that is smaller than a height of each CTU among the plurality of CTUs that is not adjacent to any boundary of the coded picture.

2. The method of claim 1, wherein each CTU among the plurality of CTUs that is not adjacent to any boundary of the coded picture has a same size.

3. The method of claim 2, wherein
   at least one row or column of CTUs includes the first column and a last column that is adjacent to the right boundary of the coded picture, and
   the first column and the last column each have a width that is smaller than a width of each CTU among the plurality of CTUs that is not adjacent to any boundary of the coded picture.

4. The method of claim 3, wherein
   the at least one row or column of CTUs further includes the first row that is adjacent to the top boundary of the coded picture and the last row that is adjacent to a bottom boundary of the coded picture, and
   the first row and the last row each have a height that is smaller than a height of each CTU among the plurality of CTUs that is not adjacent to any boundary of the coded picture.

5. The method of claim 3, wherein
   the at least one row or column of CTUs includes the first row and the last row that is adjacent to the bottom boundary of the coded picture, and
   the first row and the last row each have a height that is smaller than a height of each CTU among the plurality of CTUs that is not adjacent to any boundary of the coded picture.

6. The method of claim 1, wherein the decoding the coded picture comprises determining a size dimension of the first row or the first column.

7. The method of claim 1, wherein a size dimension of the first row or the first column is a positive integer that is a power of 2.

8. A method for video encoding, the method comprising:
   receiving video data comprising a picture; and
   encoding the video data and picture based on partitioning the picture into a plurality of coding tree units (CTUs),
   wherein a first size of CTUs in at least one of (1) a first row adjacent to a top boundary of the coded picture and (2) a first column adjacent to a left boundary of the coded picture is signaled in a high-level syntax (HLS) of a video bistream and is smaller than a second size of CTUs in rows or columns neither adjacent to the top boundary nor adjacent to the left boundary of the coded picture,
   wherein at least one row or column of CTUs, among the plurality of CTUs of the coded picture, is adjacent to a boundary of the coded picture and has a size dimension that is smaller than a corresponding size dimension of each CTU among the plurality of CTUs that is not adjacent to any boundary of the coded picture, and
   wherein:
      the at least one row or column of CTUs includes the first column and a last column that is adjacent to a right boundary of the coded picture, and the first column and the last column each have a width that is smaller than a width of each CTU among the plurality of CTUS that is not adjacent to any boundary of the coded picture, or
      the at least one row or column of CTUs includes the first row and a last row that is adjacent to a bottom boundary of the coded picture, and the first row and the last row each have a height that is smaller than a height of each CTU among the plurality of CTUs that is not adjacent to any boundary of the coded picture.

9. The method of claim 8, wherein each CTU among the plurality of CTUs that is not adjacent to any boundary of the coded picture has a same size.

10. The method of claim 9, wherein
   at least one row or column of CTUs includes the first column and a last column that is adjacent to the right boundary of the coded picture, and
   the first column and the last column each have a width that is smaller than a width of each CTU among the plurality of CTUs that is not adjacent to any boundary of the coded picture.

11. The method of claim 10, wherein
the at least one row or column of CTUs further includes the first row that is adjacent to the top boundary of the coded picture and the last row that is adjacent to a bottom boundary of the coded picture, and
the first row and the last row each have a height that is smaller than a height of each CTU among the plurality of CTUs that is not adjacent to any boundary of the coded picture.

12. The method of claim 10, wherein
the at least one row or column of CTUs includes the first row and the last row that is adjacent to the bottom boundary of the coded picture, and
the first row and the last row each have a height that is smaller than a height of each CTU among the plurality of CTUs that is not adjacent to any boundary of the coded picture.

13. The method of claim 8, wherein the decoding the coded picture comprises determining a size dimension of the first row or the first column.

14. The method of claim 8, wherein a size dimension of the first row or the first column is a positive integer that is a power of 2.

15. A method of processing visual media data, the method comprising:
performing a conversion between a visual media file and a bitstream of a visual media data according to a format rule, wherein the format rule indicates portioning of a picture of the visual media file or the visual media data such that:
a first size of CTUs in at least one of (1) a first row adjacent to a top boundary of the coded picture and (2) a first column adjacent to a left boundary of the coded picture is signaled in a high-level syntax (HLS) of a video bistream and is smaller than a second size of CTUs in rows or columns neither adjacent to the top boundary nor adjacent to the left boundary of the coded picture,
at least one row or column of CTUs, among the plurality of CTUs of the coded picture, is adjacent to a boundary of the coded picture and has a size dimension that is smaller than a corresponding size dimension of each CTU among the plurality of CTUs that is not adjacent to any boundary of the coded picture, and wherein:
the at least one row or column of CTUs includes the first column and a last column that is adjacent to a right boundary of the coded picture, and the first column and the last column each have a width that is smaller than a width of each CTU among the plurality of CTUs that is not adjacent to any boundary of the coded picture, or
the at least one row or column of CTUs includes the first row and a last row that is adjacent to a bottom boundary of the coded picture, and the first row and the last row each have a height that is smaller than a height of each CTU among the plurality of CTUs that is not adjacent to any boundary of the coded picture.

16. The method of claim 15, wherein each CTU among the plurality of CTUs that is not adjacent to any boundary of the coded picture has a same size.

17. The method of claim 16, wherein
at least one row or column of CTUs includes the first column and a last column that is adjacent to the right boundary of the coded picture, and
the first column and the last column each have a width that is smaller than a width of each CTU among the plurality of CTUs that is not adjacent to any boundary of the coded picture.

18. The method of claim 16, wherein
the at least one row or column of CTUs further includes the first row that is adjacent to the top boundary of the coded picture and the last row that is adjacent to a bottom boundary of the coded picture, and
the first row and the last row each have a height that is smaller than a height of each CTU among the plurality of CTUs that is not adjacent to any boundary of the coded picture.

19. The method of claim 16, wherein
the at least one row or column of CTUs includes the first row and the last row that is adjacent to the bottom boundary of the coded picture, and
the first row and the last row each have a height that is smaller than a height of each CTU among the plurality of CTUs that is not adjacent to any boundary of the coded picture.

20. The method of claim 15, wherein the decoding the coded picture comprises determining a size dimension of the first row or the first column.

* * * * *